US012593583B2

(12) United States Patent
Ichikawa

(10) Patent No.: US 12,593,583 B2
(45) Date of Patent: Mar. 31, 2026

(54) DISPLAY DEVICE WITH LIGHT EMISSION SEPARATION LAYERS OF DIFFERING THICKNESSES

(71) Applicant: Sony Semiconductor Solutions Corporation, Kanagawa (JP)

(72) Inventor: Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 598 days.

(21) Appl. No.: 17/298,430

(22) PCT Filed: Dec. 27, 2019

(86) PCT No.: PCT/JP2019/051453
§ 371 (c)(1),
(2) Date: May 28, 2021

(87) PCT Pub. No.: WO2020/149151
PCT Pub. Date: Jul. 23, 2020

(65) Prior Publication Data
US 2022/0037608 A1 Feb. 3, 2022

(30) Foreign Application Priority Data

Jan. 15, 2019 (JP) ................................. 2019-004125

(51) Int. Cl.
*H10K 59/30* (2023.01)
*H10K 50/13* (2023.01)
(Continued)

(52) U.S. Cl.
CPC ........... *H10K 59/30* (2023.02); *H10K 50/131* (2023.02); *H10K 59/122* (2023.02); *H10K 59/38* (2023.02);
(Continued)

(58) Field of Classification Search
CPC .. H10K 50/131; H10K 50/852; H10K 59/122; H10K 59/38; H10K 59/1201; H10K 71/00; H10K 59/30; H10K 59/876
(Continued)

(56) References Cited

U.S. PATENT DOCUMENTS 7,955,719 B2 * 6/2011 Hatwar ................... H10K 50/19
313/506
8,917,015 B2 * 12/2014 Iwata ...................... H10K 59/38
313/506

(Continued)

FOREIGN PATENT DOCUMENTS

CN 101394695 A 3/2009
CN 101404323 A 4/2009
(Continued)

OTHER PUBLICATIONS

Japanese Office Action issued Aug. 24, 2021 for corresponding Japanese Application No. 2020-566375.
(Continued)

*Primary Examiner* — Eric W Jones
(74) *Attorney, Agent, or Firm* — Michael Best & Friedrich LLP

(57) ABSTRACT

Pixels each including a light emitting unit formed by laminating a first electrode, an organic layer, and a second electrode are arranged in a two-dimensional matrix. The organic layer includes multiple light emitting layers of different types and a light emission separation layer. Each of the multiple light emitting layers of different types is laminated as a common layer extending continuously over the pixels. The light emission separation layer is arranged between two adjacent light emitting layers, and is formed so as to have a different configuration depending on a display color of the pixel.

19 Claims, 26 Drawing Sheets

(51) Int. Cl.

| | | |
|---|---|---|
| *H10K 59/12* | (2023.01) | |
| *H10K 59/122* | (2023.01) | |
| *H10K 59/38* | (2023.01) | |
| *H10K 59/80* | (2023.01) | |

(52) U.S. Cl.
CPC ....... *H10K 59/876* (2023.02); *H10K 59/1201* (2023.02)

(58) Field of Classification Search
USPC ...................................................... 257/40, 59
See application file for complete search history.

(56) References Cited

U.S. PATENT DOCUMENTS

| | | | | |
|---|---|---|---|---|
| 2005/0156515 | A1* | 7/2005 | Fukase ................. | H10K 59/352 |
| | | | | 313/504 |
| 2005/0218792 | A1* | 10/2005 | Jianpu .................. | H10K 59/351 |
| | | | | 313/502 |
| 2007/0164664 | A1* | 7/2007 | Ludwicki ............. | G09G 3/2003 |
| | | | | 313/504 |
| 2009/0079351 | A1 | 3/2009 | Choi | |
| 2009/0191428 | A1* | 7/2009 | Hatwar .................. | H10K 85/30 |
| | | | | 428/690 |
| 2010/0156280 | A1* | 6/2010 | Song .................... | H10K 50/171 |
| | | | | 313/504 |
| 2012/0176428 | A1* | 7/2012 | Credelle .............. | G09G 3/2003 |
| | | | | 345/694 |
| 2012/0229014 | A1* | 9/2012 | Shiratori .............. | H10K 59/352 |
| | | | | 313/498 |
| 2012/0299002 | A1* | 11/2012 | Kinoshita ............ | H10K 59/351 |
| | | | | 257/E33.072 |
| 2014/0001447 | A1 | 1/2014 | Kim | |
| 2014/0027732 | A1* | 1/2014 | Pyo ...................... | H10K 50/852 |
| | | | | 257/40 |
| 2014/0065750 | A1* | 3/2014 | Harikrishna Mohan ................... | |
| | | | | H10K 50/125 |
| | | | | 438/35 |
| 2014/0084269 | A1* | 3/2014 | Weaver ................ | H10K 50/131 |
| | | | | 257/40 |
| 2014/0124765 | A1* | 5/2014 | Omoto .................. | H10K 50/86 |
| | | | | 257/40 |
| 2014/0231790 | A1* | 8/2014 | Fujino ................... | H10K 59/38 |
| | | | | 257/89 |
| 2015/0054815 | A1* | 2/2015 | Toyoda ................ | G09G 3/3233 |
| | | | | 345/82 |
| 2015/0060812 | A1* | 3/2015 | Kim ....................... | H10K 59/32 |
| | | | | 257/40 |
| 2015/0115246 | A1* | 4/2015 | Domercq ............ | C03C 17/3644 |
| | | | | 174/255 |
| 2015/0236073 | A1* | 8/2015 | Chen ..................... | H10K 71/13 |
| | | | | 257/40 |

| | | | | |
|---|---|---|---|---|
| 2016/0043327 | A1* | 2/2016 | Yoo .................... | H10K 85/6576 |
| | | | | 257/40 |
| 2017/0309852 | A1* | 10/2017 | Seo ...................... | H10K 50/818 |
| 2018/0076418 | A1* | 3/2018 | Cho ........................ | H10K 59/12 |
| 2018/0114939 | A1* | 4/2018 | Oh .......................... | H10K 50/19 |
| 2019/0181202 | A1* | 6/2019 | Lim ...................... | H10K 50/19 |
| 2020/0140422 | A1* | 5/2020 | Haruyama ........... | H10K 85/633 |

FOREIGN PATENT DOCUMENTS

| | | |
|---|---|---|
| CN | 101847692 A | 9/2010 |
| CN | 102157694 A | 8/2011 |
| CN | 104979479 A | 10/2015 |
| JP | 2005222928 A | 8/2005 |
| JP | 2005235566 A | 9/2005 |
| JP | 2006269329 A | 10/2006 |
| JP | 2007273231 A | 10/2007 |
| JP | 2007280677 A | 10/2007 |
| JP | 2008258086 A | 10/2008 |
| JP | 2009-048828 A | 3/2009 |
| JP | 2009-049223 A | 3/2009 |
| JP | 2009-093810 A | 4/2009 |
| JP | 2009181755 A | 8/2009 |
| JP | 2010-231997 A | 10/2010 |
| JP | 2011065992 A | 3/2011 |
| JP | 2011-151011 A | 8/2011 |
| JP | 2012079631 A | 4/2012 |
| JP | 2012252829 A | 12/2012 |
| JP | 2013258022 A | 12/2013 |
| JP | 2014154390 A | 8/2014 |
| JP | 2014-212070 A | 11/2014 |
| JP | 2015015194 A | 1/2015 |
| JP | 2015062194 A | 4/2015 |
| JP | 2015090813 A | 5/2015 |
| JP | 2015153607 A | 8/2015 |
| JP | 2015197994 A | 11/2015 |
| JP | 2016143585 A | 8/2016 |
| JP | 2017041450 A | 2/2017 |
| JP | 2018507526 A | 3/2018 |
| JP | 2018081798 A | 5/2018 |
| JP | 2018124540 A | 8/2018 |
| KR | 20150021457 A | 3/2015 |
| WO | 2015178028 A1 | 11/2015 |

OTHER PUBLICATIONS

International Search Report (PCT/ISA/210), International Application No. PCT/JP2019/051453, dated Jan. 22, 2020.

Notification of Transmittal of the International Search Report and the Written Opinion of the International Searching Authority, or the Declaration (PCT/ISA/220), International Application No. PCT/JP2019/051453, dated Feb. 4, 2020.

Written Opinion of the International Search Authority (PCT/ISA/237), International Application No. PCT/ JP2019/051453, dated Feb. 4, 2020.

* cited by examiner

FIG. 4

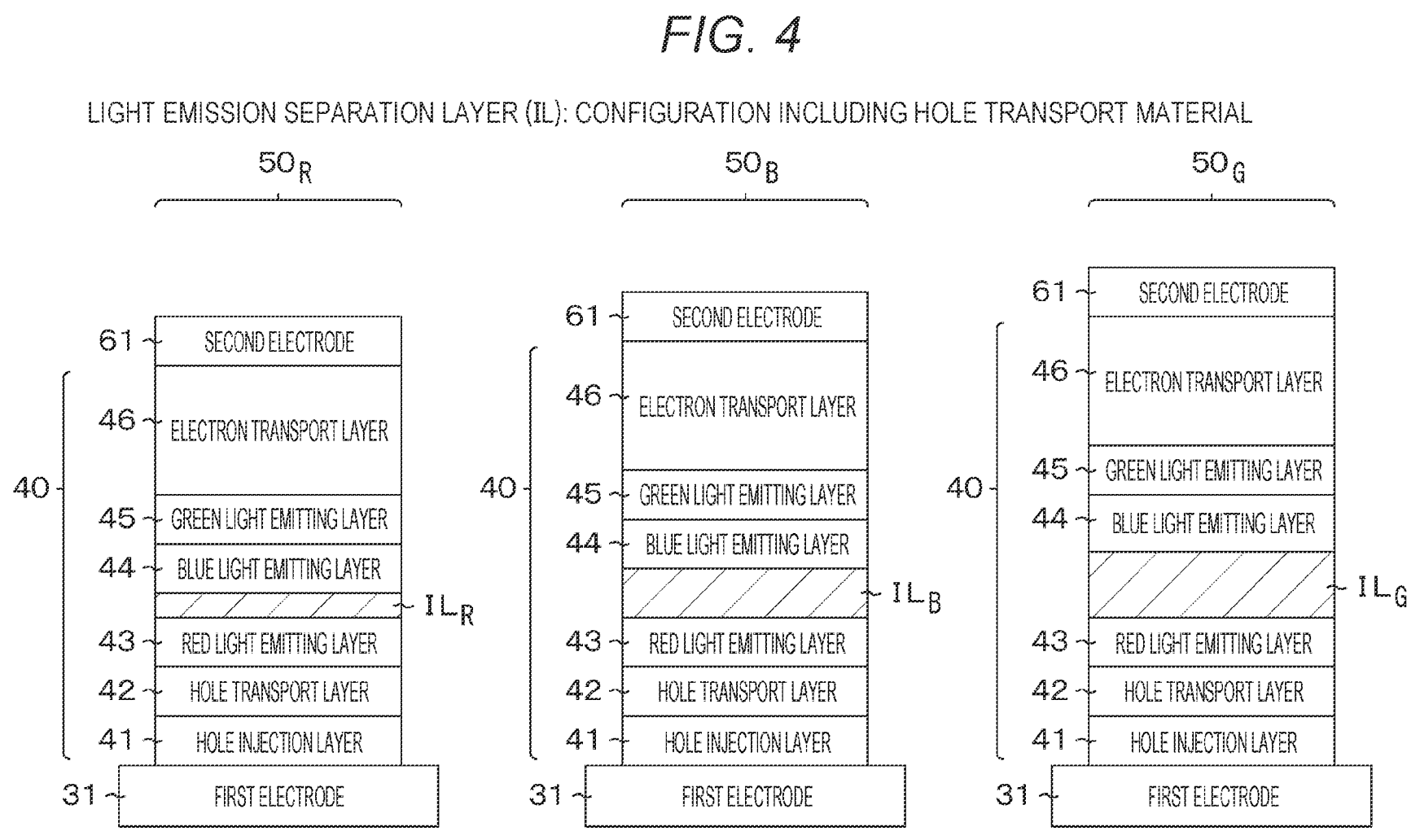

LIGHT EMISSION SEPARATION LAYER (IL): CONFIGURATION INCLUDING HOLE TRANSPORT MATERIAL $50_G$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| | $IL_G$ |
| 43 | RED LIGHT EMITTING LAYER |
| 42 | HOLE TRANSPORT LAYER |
| 41 | HOLE INJECTION LAYER |
| 31 | FIRST ELECTRODE |

40

$50_B$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| | $IL_B$ |
| 43 | RED LIGHT EMITTING LAYER |
| 42 | HOLE TRANSPORT LAYER |
| 41 | HOLE INJECTION LAYER |
| 31 | FIRST ELECTRODE |

40

$50_R$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| | $IL_R$ |
| 43 | RED LIGHT EMITTING LAYER |
| 42 | HOLE TRANSPORT LAYER |
| 41 | HOLE INJECTION LAYER |
| 31 | FIRST ELECTRODE |

LIGHT EMISSION SEPARATION LAYER (IL): CONFIGURATION INCLUDING HOLE TRANSPORT MATERIAL

WHITE LIGHT BY ADDITIVE COLOR MIXING

GREEN LIGHT

BLUE LIGHT

RED LIGHT

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| IL_W | |
| 43 | RED LIGHT EMITTING LAYER |
| 42 | HOLE TRANSPORT LAYER |
| 41 | HOLE INJECTION LAYER |
| 31 | FIRST ELECTRODE |

LIGHT EMISSION SEPARATION LAYER (IL): CONFIGURATION INCLUDING HOLE TRANSPORT MATERIAL

FIG. 7

LIGHT EMISSION SEPARATION LAYER (IL): CONFIGURATION INCLUDING HOLE TRANSPORT MATERIAL

*FIG. 8*

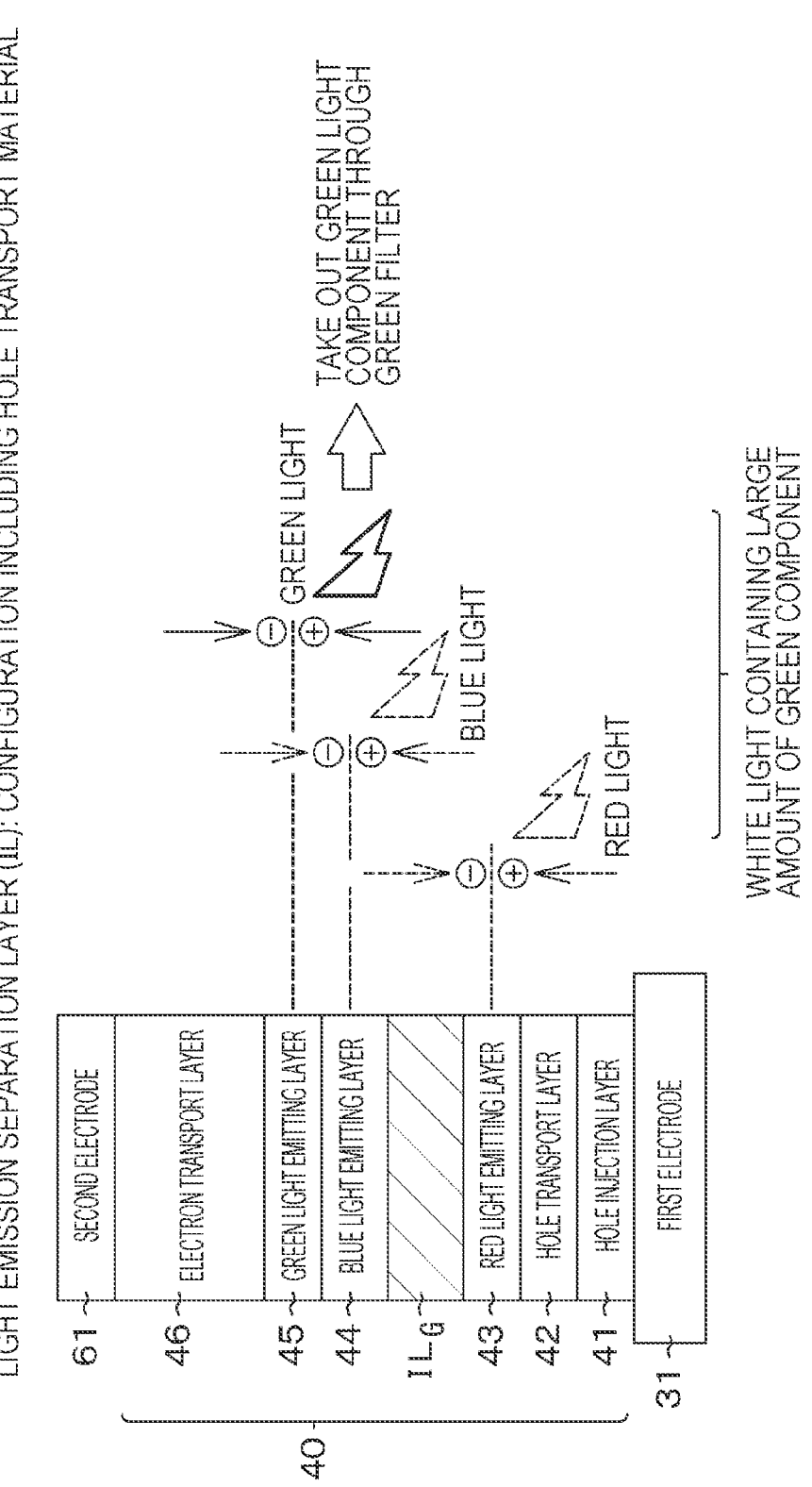

LIGHT EMISSION SEPARATION LAYER (IL): CONFIGURATION INCLUDING HOLE TRANSPORT MATERIAL

TAKE OUT GREEN LIGHT COMPONENT THROUGH GREEN FILTER

GREEN LIGHT

BLUE LIGHT

RED LIGHT

WHITE LIGHT CONTAINING LARGE AMOUNT OF GREEN COMPONENT

61 — SECOND ELECTRODE

46 — ELECTRON TRANSPORT LAYER

45 — GREEN LIGHT EMITTING LAYER

44 — BLUE LIGHT EMITTING LAYER $IL_G$

43 — RED LIGHT EMITTING LAYER

42 — HOLE TRANSPORT LAYER

41 — HOLE INJECTION LAYER

31 — FIRST ELECTRODE

LIGHT EMISSION SEPARATION LAYER (IL): CONFIGURATION INCLUDING ELECTRON TRANSPORT MATERIAL

LIGHT EMISSION SEPARATION LAYER (IL): CONFIGURATION INCLUDING CO-DEPOSITED FILM

*FIG. 14*

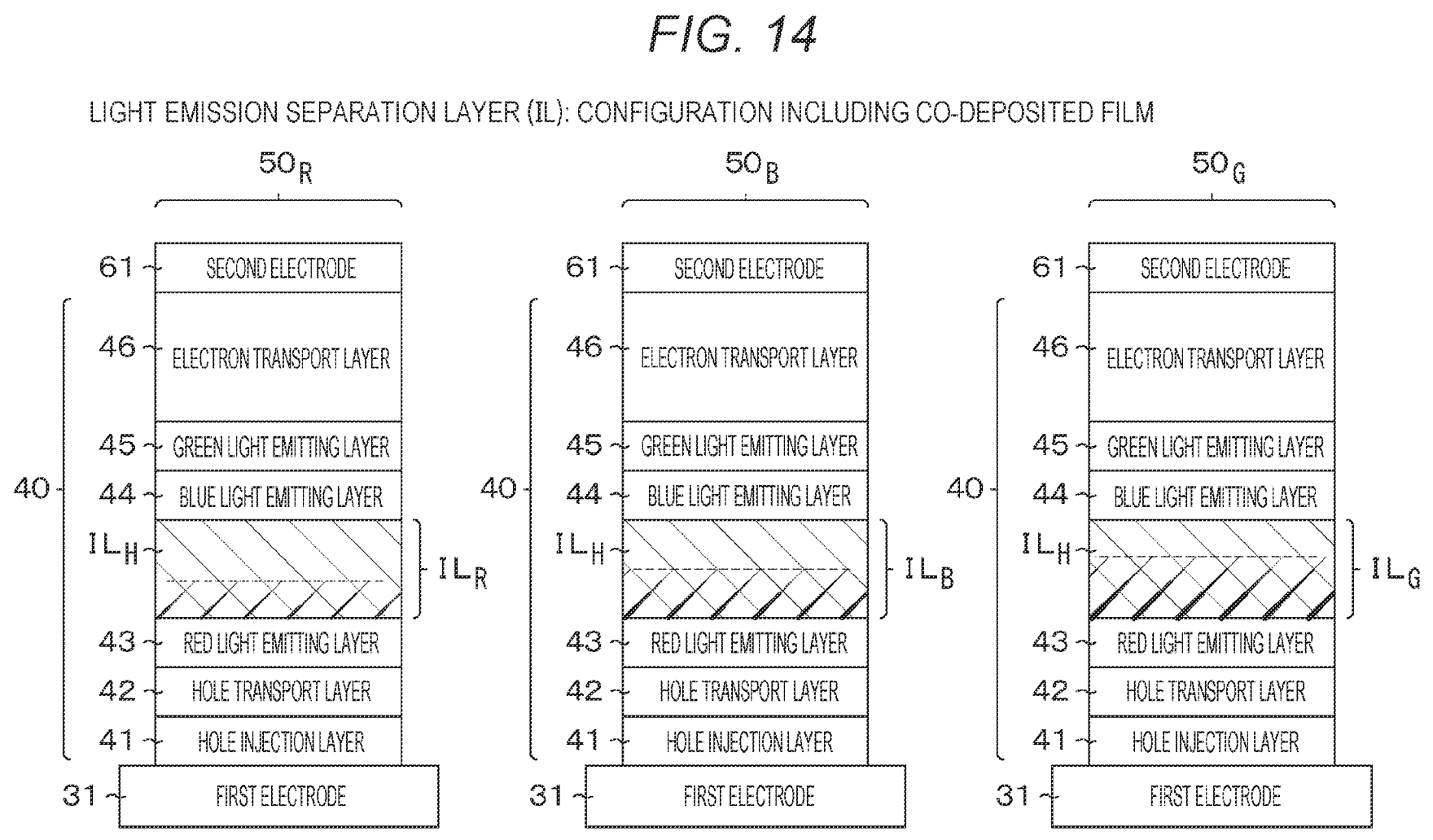

LIGHT EMISSION SEPARATION LAYER (IL): CONFIGURATION INCLUDING CO-DEPOSITED FILM $50_R$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| $IL_H$ | |
| 43 | RED LIGHT EMITTING LAYER |
| 42 | HOLE TRANSPORT LAYER |
| 41 | HOLE INJECTION LAYER |
| 31 | FIRST ELECTRODE |

40

$IL_R$ $50_B$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| $IL_H$ | |
| 43 | RED LIGHT EMITTING LAYER |
| 42 | HOLE TRANSPORT LAYER |
| 41 | HOLE INJECTION LAYER |
| 31 | FIRST ELECTRODE |

40

$IL_B$ $50_G$

| | |
|---|---|
| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| $IL_H$ | |
| 43 | RED LIGHT EMITTING LAYER |
| 42 | HOLE TRANSPORT LAYER |
| 41 | HOLE INJECTION LAYER |
| 31 | FIRST ELECTRODE |

LIGHT EMISSION SEPARATION LAYER (IL) CONFIGURATION INCLUDING MULTI-MATERIAL LAYER

50_R

| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| IL_2 | |
| IL_1 | | $\} IL_R$
| 43 | RED LIGHT EMITTING LAYER |
| 42 | HOLE TRANSPORT LAYER |
| 41 | HOLE INJECTION LAYER |
| 31 | FIRST ELECTRODE |

40

50_B

| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| IL_2 | |
| IL_1 | | $\} IL_B$
| 43 | RED LIGHT EMITTING LAYER |
| 42 | HOLE TRANSPORT LAYER |
| 41 | HOLE INJECTION LAYER |
| 31 | FIRST ELECTRODE |

40

50_G

| 61 | SECOND ELECTRODE |
| 46 | ELECTRON TRANSPORT LAYER |
| 45 | GREEN LIGHT EMITTING LAYER |
| 44 | BLUE LIGHT EMITTING LAYER |
| IL_2 | |
| IL_1 | | $\} IL_G$
| 43 | RED LIGHT EMITTING LAYER |
| 42 | HOLE TRANSPORT LAYER |
| 41 | HOLE INJECTION LAYER |
| 31 | FIRST ELECTRODE |

40

LIGHT EMISSION SEPARATION LAYER (IL):
CONFIGURATION INCLUDING LIGHT EMISSION SEPARATION LAYERS FORMED IN TWO LOCATIONS

LIGHT EMISSION SEPARATION LAYER (IL): CONFIGURATION INCLUDING HOLE TRANSPORT MATERIAL

Figures 22A, 22B:
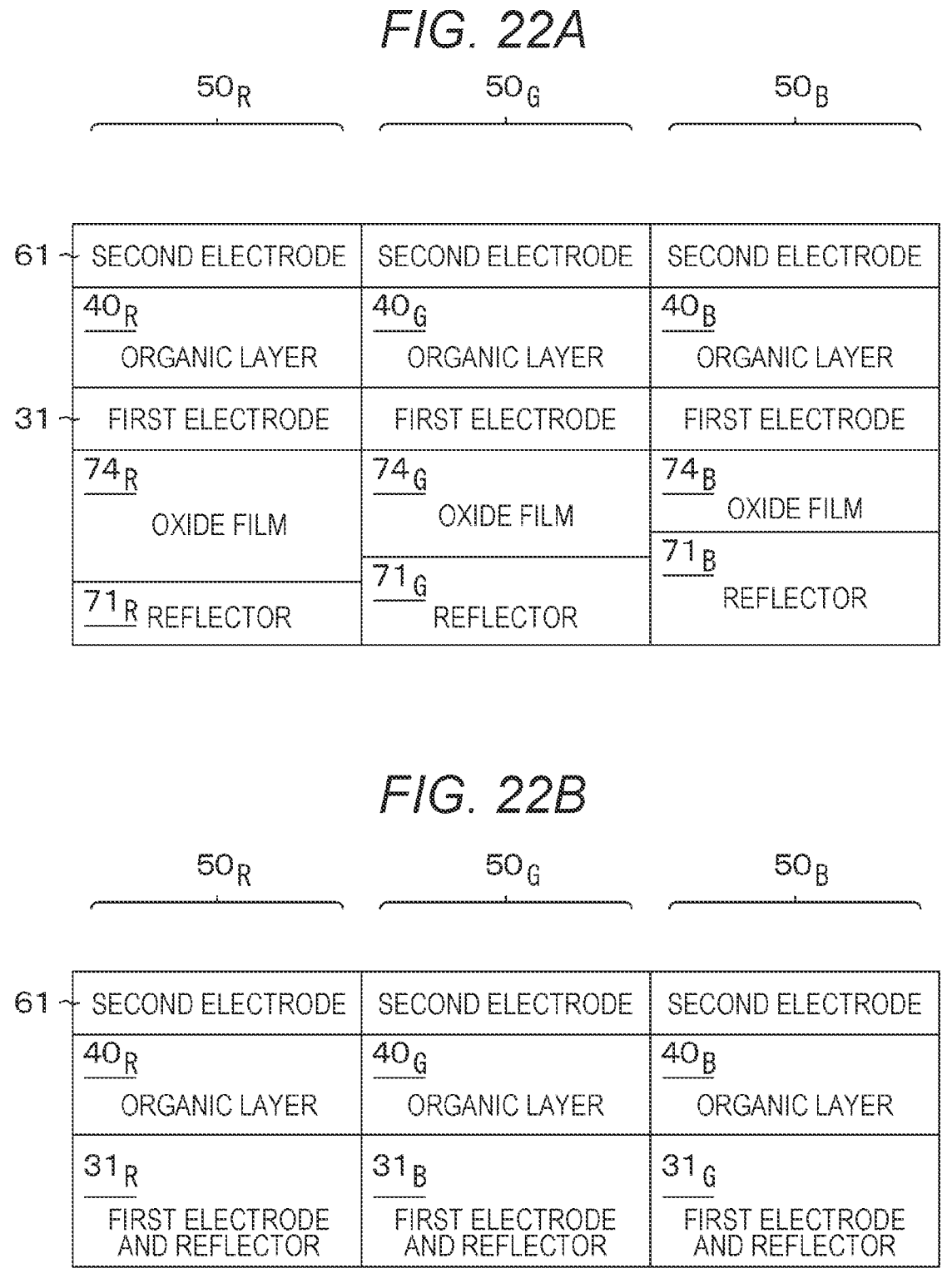

| 61 → | SECOND ELECTRODE | SECOND ELECTRODE | SECOND ELECTRODE |
|---|---|---|---|
| | $40_R$ ORGANIC LAYER | $40_G$ ORGANIC LAYER | $40_B$ ORGANIC LAYER |
| 31 → | FIRST ELECTRODE | FIRST ELECTRODE | FIRST ELECTRODE |
| | $74_R$ OXIDE FILM | $74_G$ OXIDE FILM | $74_B$ OXIDE FILM |
| | | $71_G$ REFLECTOR | $71_B$ REFLECTOR |
| | $71_R$ REFLECTOR | | |

FIG. 22B $50_R$          $50_G$          $50_B$

| 61 → | SECOND ELECTRODE | SECOND ELECTRODE | SECOND ELECTRODE |
|---|---|---|---|
| | $40_R$ ORGANIC LAYER | $40_G$ ORGANIC LAYER | $40_B$ ORGANIC LAYER |
| | $31_R$ FIRST ELECTRODE AND REFLECTOR | $31_B$ FIRST ELECTRODE AND REFLECTOR | $31_G$ FIRST ELECTRODE AND REFLECTOR |

*FIG. 23*

DISPLAY DEVICE WITH LIGHT EMISSION SEPARATION LAYERS OF DIFFERING THICKNESSES

TECHNICAL FIELD

The present disclosure relates to a display device, a manufacturing method of a display device, and an electronic instrument.

BACKGROUND ART

In recent years, the organic EL display device using electroluminescence (EL), which is an organic material, has been attracting attention as a display device to replace the liquid crystal display device. Then, the organic EL display device is being applied not only to a direct-view type display device such as a monitor, but also to an ultra-small display device that requires a fine pixel pitch of about several microns.

In organic EL display devices, as a method of achieving color display, there is a method of forming organic EL material layers of colors such as red light emission, green light emission, and blue light emission for each pixel by using a mask, for example. Hereinafter, this method may be referred to as the RGB pixelation method. The RGB pixelation method has excellent luminous efficiency and is often used for direct-view type display devices.

However, the finer the pixel pitch, the more difficult it is to form an organic EL material layer for each pixel by using a mask in terms of alignment accuracy and the like. Accordingly, in an organic EL display device having a fine pixel pitch of about several microns, a method of forming a white light emitting organic EL material layer in common for all pixels and combining color filters is preferable. Hereinafter, this method may be referred to as the white method.

The white light emitting organic EL material layer can be formed by laminating red light emitting, green light emitting, and blue light emitting light emitting layers, for example. Then, in order to obtain well-balanced white light, it is necessary to maintain a good balance of light emission intensity in the light emitting layer of each color. For this reason, there is known a technology of forming an intermediate layer (light emission separation layer) between the light emitting layers and causing each light emitting layer to emit light in a well-balanced manner (see Patent Document 1, for example).

CITATION LIST

Patent Document

Patent Document 1: Japanese Patent Application Laid-Open No. 2013-258022

SUMMARY OF THE INVENTION

Problems to be Solved by the Invention

As described above, the white method is a method suitable for an organic EL display device having a fine pixel pitch. However, in the white method, light emission due to carrier recombination is distributed to multiple light emitting layers. For this reason, the green and blue light emission in the red display pixel, the red and blue light emission in the green display pixel, and the red and green light emission in the blue display pixel do not contribute to the display. In other words, since the white method has low internal luminous efficiency, there is a problem that more power is required to obtain high brightness. Hence, there has been a demand for a technology that can further improve luminous efficiency while retaining the advantages of the white method.

Accordingly, an object of the present disclosure is to provide a display device that can further improve luminous efficiency while retaining the advantages of the white method, an electronic instrument including the display device, and a manufacturing method of the display device.

Solutions to Problems

A display device according to the present disclosure for achieving the above object is a display device in which pixels each including a light emitting unit formed by laminating a first electrode, an organic layer, and a second electrode are arranged in a two-dimensional matrix, in which:

the organic layer includes multiple light emitting layers of different types and a light emission separation layer;

each of the multiple light emitting layers of different types is laminated as a common layer extending continuously over the pixels; and the light emission separation layer is arranged between two adjacent light emitting layers, and is formed so as to have a different configuration depending on a display color of the pixel.

A manufacturing method of a display device according to the present disclosure for achieving the above object is a manufacturing method of a display device in which pixels each including a light emitting unit formed by laminating a first electrode, an organic layer, and a second electrode are arranged in a two-dimensional matrix, the method including the steps of forming the first electrode so as to correspond to each pixel, and laminating each of multiple light emitting layers of different types as a continuous common layer on an entire surface including the first electrodes, and forming a light emission separation layer arranged between two adjacent light emitting layers, so that a configuration of the light emission separation layer differs depending on a display color of the pixel.

An electronic instrument according to the present disclosure for achieving the above object is an electronic instrument including a display device in which pixels each including a light emitting unit formed by laminating a first electrode, an organic layer, and a second electrode are arranged in a two-dimensional matrix, in which:

the organic layer includes multiple light emitting layers of different types and a light emission separation layer;

each of the multiple light emitting layers of different types is laminated as a common layer extending continuously over the pixels; and the light emission separation layer is arranged between two adjacent light emitting layers, and is formed so as to have a different configuration depending on a display color of the pixel.

BRIEF DESCRIPTION OF DRAWINGS

FIG. 4 is a schematic cross-sectional view for describing the lamination relationship of a first electrode, an organic layer, and a second electrode in a light emitting unit.

FIG. 5 is a schematic cross-sectional view for describing carrier recombination in a light emitting unit that emits white light by additive color mixing.

FIG. 6 is a schematic cross-sectional view for describing a case where red light is taken out from a light emitting unit that emits white light containing a large amount of red components through a color filter.

Figure 7:
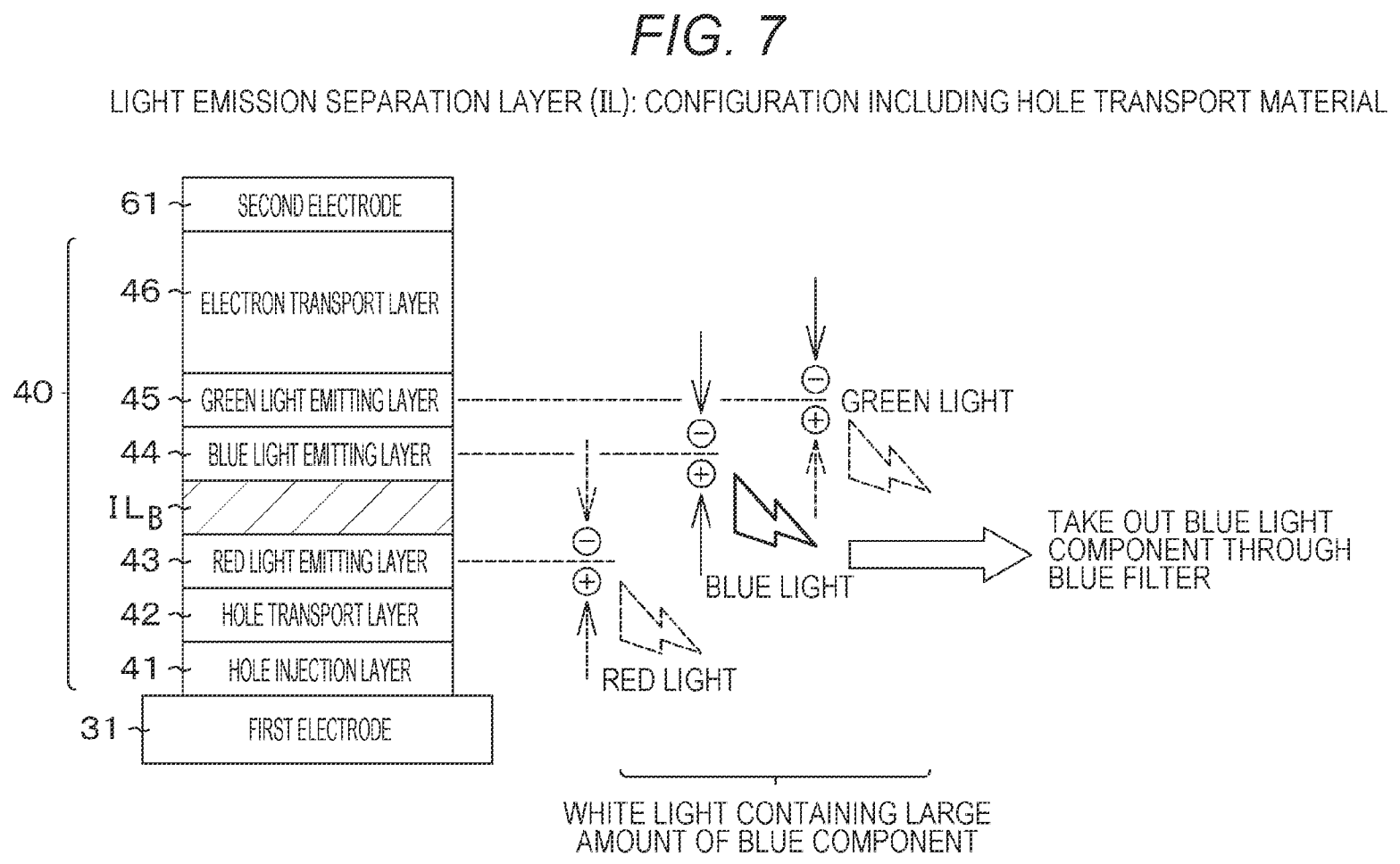

FIG. 7 is a schematic cross-sectional view for describing a case where blue light is taken out from a light emitting unit that emits white light containing a large amount of blue components through a color filter.

FIG. 8 is a schematic cross-sectional view for describing a case where green light is taken out from a light emitting unit that emits white light containing a large amount of green components through a color filter.

FIG. 9 is a schematic cross-sectional view for describing the lamination relationship of a first electrode, an organic layer, and a second electrode in a light emitting unit when a light emission separation layer includes an electron transport material.

FIG. 10 is a schematic cross-sectional view for describing a substrate in which a partition wall is formed between adjacent first electrodes.

FIG. 12 is a schematic cross-sectional view for describing a modification of a substrate in which a partition wall is formed between adjacent first electrodes.

FIG. 14 is a schematic cross-sectional view for describing the lamination relationship of a first electrode, an organic layer, and a second electrode in a light emitting unit of a display device according to a modification of the second embodiment.

FIG. 15 is a schematic cross-sectional view for describing the lamination relationship of a first electrode, an organic layer, and a second electrode in a light emitting unit of a display device according to a third embodiment.

FIG. 19 is a schematic cross-sectional view for describing a configuration example of a substrate used for manufacturing the display device according to the fifth embodiment.

FIG. 22A is a schematic cross-sectional view for describing a fifth example of the resonator structure. FIG. 22B is a schematic cross-sectional view for describing a sixth example of the resonator structure.

FIG. 23 is a schematic cross-sectional view for describing a seventh example of the resonator structure.

MODE FOR CARRYING OUT THE INVENTION

Figure 1:
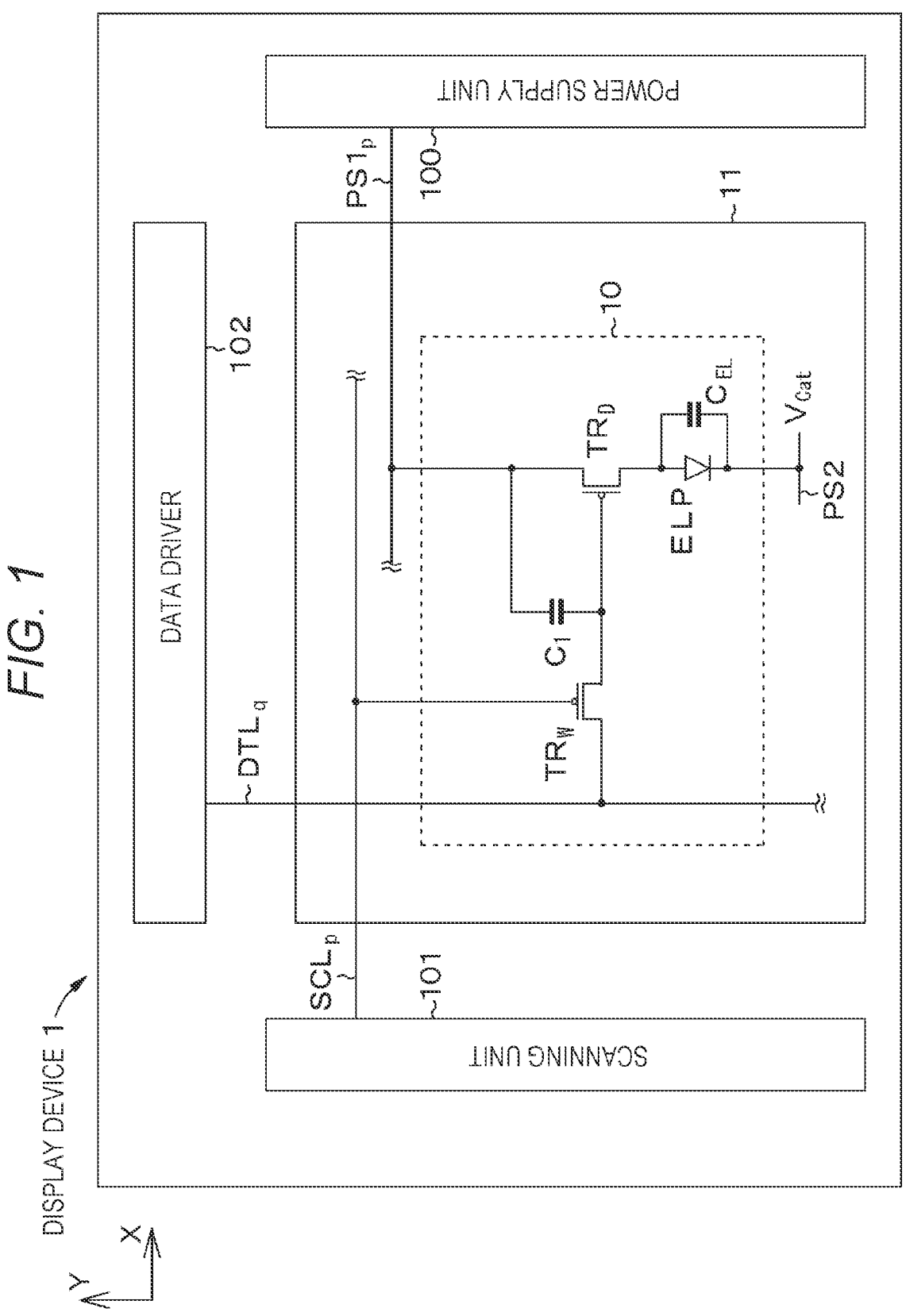
FIG. 1 is a schematic plan view of a display device according to a first embodiment.

Hereinafter, the present disclosure will be described on the basis of embodiments with reference to the drawings. The present disclosure is not limited to the embodiments, and various numerical values and materials in the embodiments are examples. In the following description, the same elements or elements having the same function will be denoted by the same reference signs, without redundant description. Note that the description will be given in the following order.

1. Overall description of display device, manufacturing method of display device, and electronic instrument of present disclosure
2. First embodiment
3. Second embodiment
4. Third embodiment
5. Fourth embodiment
6. Fifth embodiment
7. Example of resonator structure applied to each embodiment
8. Description of electronic instrument, and other

Overall Description of Display Device, Manufacturing Method of Display Device, and Electronic Instrument of Present Disclosure In a display device according to the present disclosure, a display device used for an electronic instrument according to the present disclosure, and a display device obtained by a manufacturing method of a display device according to the present disclosure (hereinafter, these may simply be referred to as "display device of the present disclosure"), as described above, pixels each including a light emitting unit formed by laminating a first electrode, an organic layer, and a second electrode are arranged in a two-dimensional matrix, the organic layer includes multiple light emitting layers of different types and a light emission separation layer, each of the multiple light emitting layers of different types is laminated as a common layer extending continuously over the pixels, and the light emission separation layer is arranged between two adjacent light emitting layers, and is formed so as to have a different configuration depending on a display color of the pixel. In this case, the light emission separation layer may be formed so that the film thickness differs depending on the display color of the pixel.

In this case, the light emission separation layer may be formed by using at least one of a hole transport material, an electron transport material, or a bipolar charge transport material.

Alternatively, in the display device of the present disclosure, the light emission separation layer may be formed by using a material having a different configuration depending on the display color of the pixel.

The light emission separation layer can be formed by co-depositing multiple different types of materials. Then, the light emission separation layer may be formed so that the concentration relationship of multiple different types of materials differs depending on the display color of the pixel. Additionally, the light emission separation layer may be formed by co-depositing at least two of a hole transport material, an electron transport material, or a bipolar charge transport material.

Alternatively, in the display device of the present disclosure, the light emission separation layer may be formed by laminating multiple different types of materials. Then, the light emission separation layer may be formed so that the lamination ratio of multiple different types of materials differs depending on the display color of the pixel. Additionally, the light emission separation layer may be formed by laminating at least two of a hole transport material, an electron transport material, or a bipolar charge transport material.

Alternatively, in the display device of the present disclosure, the organic layer may include a first light emitting layer, a second light emitting layer, and a third light emitting layer, each of which is different in type, the light emitting layers may be arranged in the order of the first light emitting layer, the second light emitting layer, and the third light emitting layer, each light emitting layer being arranged as a common layer extending continuously over the pixels, and the light emission separation layer may include a first light emission separation layer arranged between the first light emitting layer and the second light emitting layer, and a second light emission separation layer arranged between the second light emitting layer and the third light emitting layer. In this case, at least one of the first light emission separation layer or the second light emission separation layer may be formed so as to have a different configuration depending on the display color of the pixel. The first light emission separation layer and the second light emission separation layer may be formed by using at least one of a hole transport material, an electron transport material, or a bipolar charge transport material.

In the display device of the present disclosure including the various preferable configurations described above, the organic layer may include a red light emitting layer, a blue light emitting layer, and a green light emitting layer, and the light emitting layers may be laminated in the order of the red light emitting layer, the blue light emitting layer, and the green light emitting layer, each light emitting layer being laminated as a common layer extending continuously over the pixels.

In the display device of the present disclosure including the various preferable configurations described above, a color filter corresponding to the color to be displayed may be arranged on an upper surface of each pixel. In the case of color display, red, blue, and green color filters can be arranged, for example. The color filter can be formed by appropriately patterning a layer containing a well-known pigment or dye. Note that in addition to red, blue, and green, a transparent color filter may also be arranged. In this configuration, the image can be displayed using white pixels in addition to the red, blue, and green pixels, so that the brightness can be improved.

In the display device of the present disclosure including the various preferable configurations described above, the pixel may include a resonator structure that resonates light generated in the light emitting unit. By providing a resonator structure corresponding to the light of the color to be displayed, the color purity and the peak intensity can be improved. Various resonator structures can be applied to the display device of the present disclosure.

As described above, a manufacturing method of a display device according to the present disclosure includes the steps of forming the first electrode so as to correspond to each pixel, and laminating each of multiple light emitting layers of different types as a continuous common layer on an entire surface including the first electrodes, and forming the light emission separation layer arranged between two adjacent light emitting layers, so that the configuration of the light emission separation layer differs depending on the display color of the pixel.

In this case, the manufacturing method may further include the step of forming a partition wall between adjacent first electrodes, and with the ratio between the height of the partition wall surrounding the first electrode and the width of the first electrode set to be different depending on an emission color of the pixel, the light emitting layer may be line-deposited with a predetermined film forming width, and the light emission separation layer may be line-deposited with a wider film forming width than the film forming width of the light emitting layer.

According to this configuration, it is possible to cope with a delicate pixel pitch, and with a simple method such as line-depositing the light emission separation layer, the light emission separation layer can be arranged between two adjacent light emitting layers and can be formed so as to have a different configuration depending on the display color of the pixel.

In the display device, the manufacturing method of a display device, and the electronic instrument (hereinafter, these may be simply referred to as the present disclosure), the first electrode may be formed by using a light-reflecting conductive material such as aluminum (Al), aluminum alloy, platinum (Pt), gold (Au), chromium (Cr), and tungsten (W), for example. Alternatively, well-known transparent conductive materials such as indium tin oxide (ITO), indium zinc oxide (IZO), and zinc oxide (ZnO) can be used. In this case, it is preferable that the structure is laminated with a reflective layer made of a light reflecting material. The first electrode can be formed by a combination of a well-known film forming method such as a sputtering method and a well-known patterning method such as an etching method or a lift-off method.

In the present disclosure, the second electrode preferably includes a material having good light transmission and a small work function. For example, the second electrode can be formed by using a transparent conductive material such as indium tin oxide (ITO) or indium zinc oxide (IZO), or a metal material such as magnesium (Mg), silver (Ag), or an alloy thereof. The thickness of the second electrode is preferably set to about 3 to 100 nanometers. Additionally, the second electrode may be configured as a multilayer film.

The second electrode can be formed as an electrode common to the pixels, and can be formed by a film forming method such as a sputtering method.

The light emitting material included in the light emitting layer may be a fluorescent material or a phosphorescent material. The composition of the light emitting material is not particularly limited, and a well-known material such as a mixture of 4,4-bis (2,2-diphenylbinine) biphenyl (DPVBi) and 2,6-bis [(4'-methoxydiphenylamino) styryl]-1,5-dicyanonaphthalene (BSN) (red light emission), a mixture of DPVBi and 4,4'-bis [2-{4-(N,N-diphenylamino) phenyl} vinyl] biphenyl (DPAVBi) (blue light emission), or a mixture of DPVBi and coumarin 6 (green light emission) can be used. Additionally, the light emitting layer of each color can be formed by appropriately adding a transport material of carriers such as electrons and holes in addition to the above-mentioned light emitting material.

The hole transport material is also used for a hole injection layer or the like that assists in injecting holes into the light emitting layer, and examples thereof include well-known materials such as copper phthalocyanine, hexaazatriphenylene (HAT), and $\alpha$-NPD [N,N'-di (1-naphthyl)-N, N'-diphenyl-[1,1'-biphenyl]-4,4'-diamine. Additionally, the electron transport material is also used for an electron injection layer that assists in injecting electrons into the light-emitting layer, and examples thereof include well-known materials such as BCP (2,9-dimethyl-4,7-diphenyl-1,10-phenanthroline), metal complexes of 8-hydroxyquinoline or derivatives thereof and nitrogen-containing heterocyclic derivatives (e.g., tris (8-quinolinol) aluminum complexes, benzimidazole derivatives, phenanthroline derivatives, imidazole pyridine derivatives), and the like. Examples of the bipolar charge transport material include a material such as an aminostyryl compound and a material obtained by co-depositing a hole transport material and an electron transport material.

As the pixel values of the display device, examples of image display resolutions include VGA (640,480), S-VGA (800,600), XGA (1024,768), APRC (1152,900), S-XGA (1280,1024), U-XGA (1600,1200), HD-TV (1920,1080), Q-XGA (2048,1536), and (1920,1035), (720,480), (1280, 960). However, the value is not limited to the above.

The insulating film used in the display device can be formed by using a material appropriately selected from known inorganic materials and organic materials, and can be formed by a well-known film forming method such as a physical vapor deposition method (PVD method) exemplified by a vacuum vapor deposition method and a sputtering method or various chemical vapor deposition methods (CVD method), for example. Additionally, when these are patterned, they can be performed by a combination of well-known patterning methods such as an etching method and a lift-off method.

In the display device according to the present disclosure, the configuration of the drive circuit and the like for controlling the light emission of the light emitting unit is not particularly limited. The light emitting unit may be formed, for example, in a certain plane on the substrate, and may be arranged above the drive circuit for driving the light emitting unit through an interlayer insulating layer, for example. The configuration of the transistors included in the drive circuit is not particularly limited. The transistor may be a p-channel field effect transistor or an n-channel field effect transistor.

Examples of the material of the substrate include a semiconductor material, a glass material, and a plastic material. In a case where the drive circuit includes transistors formed on a semiconductor substrate, a well region may be provided on a semiconductor substrate including silicon, and transistors may be formed in the wells, for example. On the other hand, in a case where the drive circuit includes thin film transistor or the like, a semiconductor thin film can be formed on the substrate including a glass material or a plastic material to form the drive circuit. The various wirings can have a well-known configuration and structure.

Various conditions of the present specification are satisfied not only in a case where the conditions are strictly established, but also in a case where the conditions are substantially established. Different variations caused by design or manufacturing are permissible. Additionally, the figures used in the following description are schematic. For example, FIG. 2 to be described later shows a cross-sectional structure of a display device, but does not show the ratio of width, height, thickness, and the like.

First Embodiment

A first embodiment relates to a display device, a manufacturing method of a display device, and an electronic instrument according to the present disclosure.

FIG. 1 is a schematic plan view of the display device according to the first embodiment of the present disclosure. A display device 1 includes a display area 11 formed by arranging pixels 10 in a two-dimensional matrix, the pixel 10 including a light emitting unit ELP and a drive circuit driving the light emitting unit ELP and connected to a scanning line SCL extending in the row direction (direction X in FIG. 1) and a data line DTL extending in the column direction (direction Y in FIG. 1), a power supply unit 100 that supplies voltage to a power supply line PS1, a scanning unit 101 that supplies scanning signals to the scanning line SCL, and a data driver 102 that supplies a signal voltage to the data line DTL. Note that for convenience of illustration, FIG. 1 shows the wiring relationship for one pixel 10, more specifically, the (q, p)th pixel 10 described later.

The display device 1 further includes a common power supply line PS2 that is commonly connected to all the pixels 10. A predetermined drive voltage is supplied to the power supply line PS1 from the power supply unit 100, and a common voltage (e.g., ground potential) is supplied to the common power supply line PS2.

Although not shown in FIG. 1, in the display area 11, a total of Q×P pixels (display elements) 10 (Q pixels 10 in the row direction and P pixels 10 in the column direction) are arranged in a two-dimensional matrix. In the display area, there are P rows of pixels 10, and Q pixels 10 in each row.

Additionally, there are P scanning lines SCL and P power supply lines PS1. The pixel 10 in the pth row (where p=1, 2, . . . , P) is connected to the pth scanning line $SCL_p$ and the pth power supply line $PS1_p$, and is included in one display element row. Note that FIG. 1 shows only the scanning line $SCL_p$ and the power supply line $PS1_p$.

Additionally, there are Q data lines DTL. The pixel 10 in the qth column (where q=1, 2, . . . , Q) is connected to the qth data line $DTL_q$. Note that FIG. 1 shows only the data line $DTL_q$.

Figure 2:
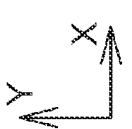
FIG. 2 is a schematic plan view for describing the arrangement of pixels in a display area.

FIG. 2 is a schematic plan view for describing the arrangement of pixels in the display area. The display device 1 is a color display device, for example. One pixel 10 forms one sub-pixel. In the following description, a red display pixel may be represented by reference sign $10_R$, a blue display pixel may be represented by reference sign $10_B$, and a green display pixel may be represented by reference sign $10_G$. Additionally, in a case where the type of pixel is not limited, these are collectively denoted as pixel 10.

The display device 1 is line-sequentially scanned row by row by scanning signals from the scanning unit 101. The pixel 10 located in the pth row and the qth column is hereinafter referred to as the (q, p)th pixel 10 or the (q, p)th pixel 10.

In the display device 1, the Q pixels 10 arranged in the pth row are driven at the same time. In other words, for the Q pixels 10 arranged along the row direction, the light emission and non-emission timing is controlled for each row to which they belong. When the display frame rate of the display device 1 is expressed as FR (times/second), the scanning period per row (so-called horizontal scanning period) when the display device 1 is line-sequentially scanned row by row is less than $(1/FR) \times (1/P)$ seconds.

As shown in FIG. 1, the pixel 10 includes the light emitting unit ELP and a drive circuit that drives the light emitting unit ELP. The light emitting unit ELP includes an organic electroluminescence light emitting unit. The drive circuit includes a write transistor $TR_W$, a drive transistor $TR_D$, and a capacitance section $C_1$. When a current flows through the light emitting unit ELP through the drive transistor $TR_D$, the light emitting unit ELP emits light. Each transistor includes a p-channel field effect transistor.

In the pixel 10, one source/drain region of the drive transistor $TR_D$ is connected to one end of the capacitance section $C_1$ and the power supply line PS1, and the other source/drain region of the drive transistor $TR_D$ is connected to one end (specifically, anode electrode) of the light emitting unit ELP. The gate electrode of the drive transistor $TR_D$ is connected to the other source/drain region of the write transistor $TR_W$ and is connected to the other end of the capacitance section $C_1$.

Additionally, in the write transistor $TR_W$, one source/drain region is connected to the data line DTL, and the gate electrode is connected to the scanning line SCL.

The other end of the light emitting unit ELP (specifically, cathode electrode) is connected to the common power supply line PS2. A predetermined cathode voltage $V_{Cat}$ is supplied to the common power supply line PS2. Note that the capacitance of the light emitting unit ELP is represented by reference sign $C_{EL}$.

A general outline of driving of the pixel 10 will be described. When the write transistor $TR_W$ is brought into conduction by a scanning signal from the scanning unit 101 while a voltage corresponding to the brightness of the image to be displayed is supplied to the data line DTL from the data driver 102, the voltage corresponding to the brightness of the image to be displayed is written to the capacitance section $C_1$. After the write transistor $TR_W$ is brought out of conduction, the light emitting unit ELP emits light when a current flows through the drive transistor $TR_D$ according to the voltage held in the capacitance section $C_1$.

Note that in the present disclosure, the configuration of the drive circuit that controls light emission of the pixel 10 is not particularly limited. Accordingly, the configuration shown in FIG. 1 is only an example, and the display device according to the present embodiment may have various configurations.

Next, the basic structure of the display device 1 will be described.

Figure 3:
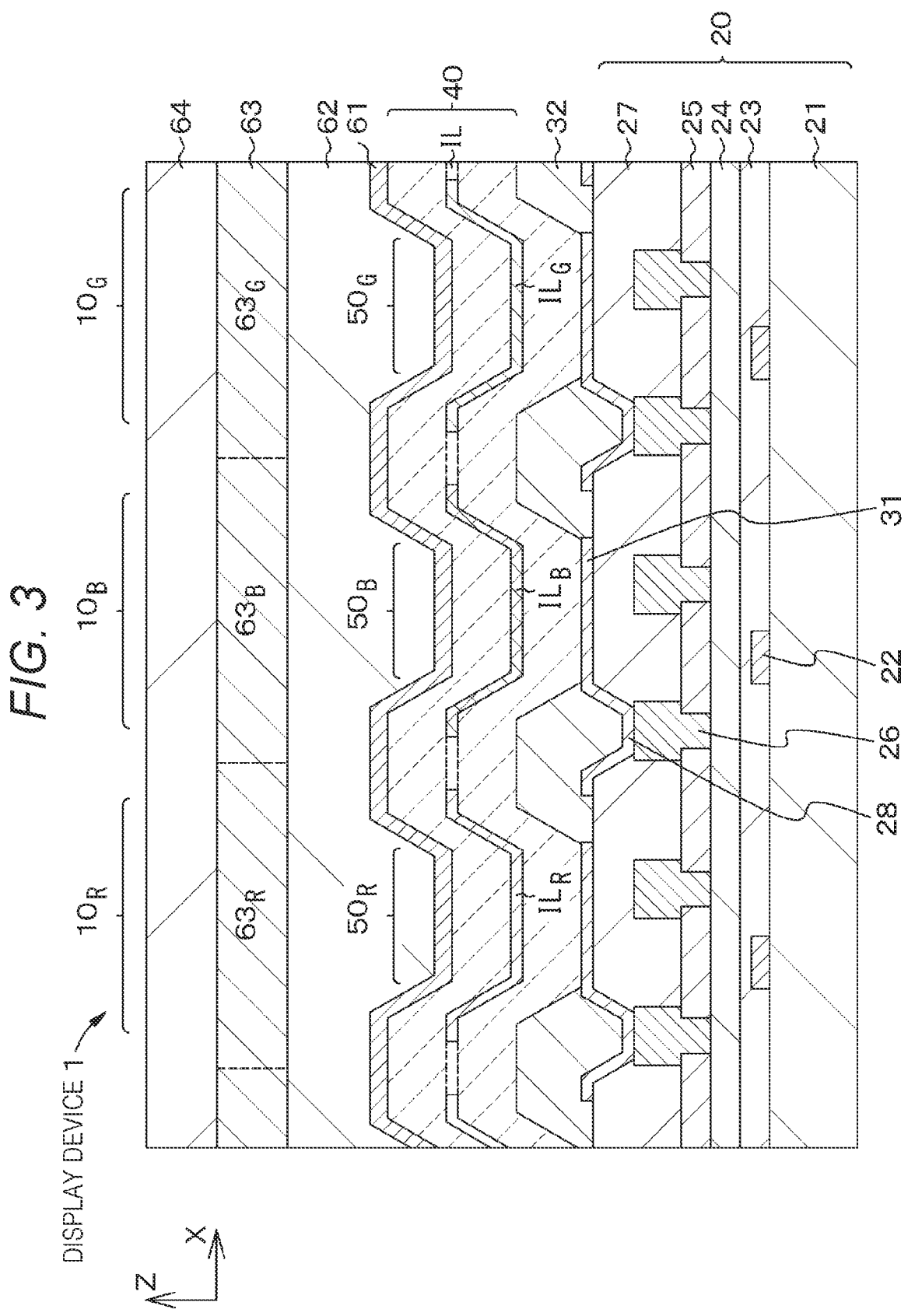
FIG. 3 is a schematic partial cross-sectional view of the display device.

FIG. 3 is a schematic partial cross-sectional view of the display device according to the first embodiment.

The display device 1 is formed by arranging the pixels 10 in a two-dimensional matrix, the pixel 10 including a light emitting unit 50 formed by laminating a first electrode 31, an organic layer 40, and a second electrode 61. The light emitting unit 50 corresponds to the light emitting unit ELP in FIG. 1.

The organic layer 40 includes multiple light emitting layers of different types and a light emission separation layer IL. Then, the light emission separation layer IL is arranged between two adjacent light emitting layers, and is formed so as to have a different configuration depending on the display color of the pixel 10. Note that for convenience of illustration, the configuration of the organic layer 40 is shown in a simplified manner in FIG. 3.

As will be described in detail later with reference to FIG. 4 and other drawings, each of the multiple light emitting layers of different types is laminated as a common layer extending continuously over the pixels 10. Then, the light emission separation layer IL is arranged between two adjacent light emitting layers, and is formed so as to have a different configuration depending on the display color of the pixel 10.

The light emitting unit 50 is formed by laminating the first electrode 31, the organic layer 40, and the second electrode 61. In the following description, the light emitting unit corresponding to the red display pixel $10_R$ is represented by reference sign $50_R$, the light emitting unit corresponding to the blue display pixel $10_B$ is represented by reference sign $50_B$, and the light emitting unit corresponding to the green display pixel $10_G$ is represented by reference sign $50_G$. Additionally, when the type of the light emitting unit is not limited, the light emitting units are collectively referred to as light emitting unit 50. The same applies to other reference numbers.

The first electrode 31 is formed so as to correspond to each pixel 10. A partition wall 32 as an inter-pixel insulating film is formed between adjacent first electrodes. Then, the organic layer 40 and the second electrode 61 are laminated on the entire surface including the first electrode 31 and the partition wall 32. A color filter 63 is arranged on top of the second electrode 61 with a protective film 62 interposed therebetween, and further, a transparent front substrate 64 is arranged on the color filter 63.

The first electrode 31 is formed on a flattening film 27 so as to correspond to each pixel 10, and functions as an anode electrode. On the other hand, the second electrode 61 is formed as an electrode common to the pixels 10, and functions as a cathode electrode.

A substrate 20 includes a base material 21, a gate electrode 22 formed on the base material 21, a gate insulating film 23 formed so as to cover the entire surface including the gate electrode 22, a semiconductor material layer 24, an interlayer insulating film 25 formed so as to cover the entire surface including the semiconductor material layer 24, a source/drain electrode 26 connected to the source/drain region of the transistor formed in the semiconductor material layer 24, and the flattening film 27 formed so as to cover the entire surface including the source/drain electrode 26.

The substrate 20 includes a drive circuit for driving the pixel 10, which includes the above-mentioned transistors and the like. Then, the first electrode 31 and the drive circuit are electrically connected. More specifically, the first electrode 31 is connected to the source/drain electrode 26 of the transistor formed in the semiconductor material layer 24 through a contact plug 28. The contact plug 28 includes a metal material such as copper (Cu) or a copper alloy, for example, and is formed in an opening provided in the flattening film 27.

The base material 21 can include, for example, a glass material, a semiconductor material, a plastic material, or the like. A drive circuit including a thin film transistor that controls light emission of the light emitting unit 50 is formed on the base material 21.

The gate electrode 22 of various transistors included in the drive circuit can be formed by using, for example, a metal such as aluminum (Al), polysilicon, or the like. The gate insulating film 23 is provided on the entire surface of the base material 21 so as to cover the gate electrode 22. The gate insulating film 23 can be formed by using, for example, silicon oxide ($SiO_x$), silicon nitride ($SiN_x$), or the like.

The semiconductor material layer 24 can be formed on the gate insulating film 23 by using, for example, amorphous silicon, polycrystalline silicon, an oxide semiconductor, or the like. Additionally, a part of the semiconductor material layer 24 is doped with impurities to form a source/drain region. Moreover, a channel region is formed in a region of the semiconductor material layer 24 located between one source/drain region and the other source/drain region and above the gate electrode 22. As a result, a bottom gate type thin film transistor is provided on the base material 21. Note that in FIG. 3, the source/drain regions and the channel region are omitted.

The interlayer insulating film 25 is provided on the semiconductor material layer 24. The interlayer insulating film 25 includes, for example, silicon oxide ($SiO_x$), silicon nitride ($SiN_x$), silicon oxynitride ($SiO_xN_y$), or the like. The source/drain electrode 26 is connected to the semiconductor material layer 24 through a contact hole provided in the interlayer insulating film 25. The source/drain electrode 26 includes a metal such as aluminum (Al).

The flattening film 27 is formed to cover and flatten the drive circuit and the like. The flattening film 27 can be formed by using, for example, an organic insulating film such as a polyimide resin, an acrylic resin, or a novolak resin, or an inorganic insulating film such as a silicon oxide ($SiO_x$), a silicon nitride ($SiN_x$), or a silicon oxynitride ($SiO_xN_y$).

The contact plug 28 includes a metal material such as copper (Cu) or a copper alloy, for example, and is formed in an opening provided in the flattening film 27. The first electrode 31 and the source/drain electrode 26 of the drive transistor are electrically connected by the contact plug 28.

The first electrode 31 includes a light reflecting material such as aluminum (Al). Note that in some cases, the first electrode 31 may be formed by laminating a transparent conductive material and the above-mentioned light reflecting material. The thickness of the first electrode 31 is preferably set in the range of about 100 to 300 nanometers.

The organic layer 40 is formed on the entire surface including the first electrode 31 and the partition wall 32. The light emitting layer of the organic layer 40 is commonly formed over the pixels 10, and basically emits white light. The second electrode 61 is formed on the entire surface including the organic layer 40. The second electrode 61 includes a material having good light transmission and a small work function, such as indium zinc oxide (IZO).

The protective film 62 is formed on the entire surface including the second electrode 61. The protective film 62 is for preventing entry of water into the organic layer 40, and is formed by using a material having low water permeability. As the material of the protective film 62, silicon nitride ($SiN_x$), silicon oxide ($SiO_x$), aluminum oxide ($AlO_x$), titanium oxide ($TiO_x$), or a combination thereof is used.

A color filter corresponding to the color to be displayed is arranged on an upper surface of each pixel. That is, the color filter 63 arranged on the protective film 62 includes a color filter $63_R$ corresponding to the red display pixel $10_R$, a color filter $63_B$ corresponding to the blue display pixel $10_B$, and a color filter $63_G$ corresponding to the green display pixel $10_G$. Light from the light emitting unit 50 is emitted through the color filter 63 and the front substrate 64, and is observed as an image.

The basic structure of the display device 1 has been described above. Next, the lamination relationship in the light emitting unit will be described in detail.

FIG. 4 is a schematic cross-sectional view for describing the lamination relationship of the lower electrode, the organic layer, and the upper electrode in the light emitting unit.

As shown in FIG. 4, the light emitting unit 50 is formed by laminating the first electrode 31, the organic layer 40, and the second electrode 61. The organic layer 40 includes different types of light emitting layers such as a first light emitting layer (hereinafter referred to as red light emitting layer) 43, a second light emitting layer (hereinafter referred to as blue light emitting layer) 44, and a third light emitting layer (hereinafter referred to as green light emitting layer) 45, and further includes the light emission separation layer IL. The organic layer 40 further includes a hole injection layer 41, a hole transport layer 42, and an electron transport layer 46. The light emitting layers are laminated in the order of the red light emitting layer 43, the blue light emitting layer 44, and the green light emitting layer 45, each of the light emitting layers being laminated as a common layer extending continuously over the pixels. The same applies to the hole injection layer 41, the hole transport layer 42, and the electron transport layer 46.

The light emission separation layer IL is arranged between two adjacent light emitting layers, more specifically, between the red light emitting layer 43 and the blue light emitting layer 44. The light emission separation layer IL can be formed by using at least one of a hole transport material, an electron transport material, or a bipolar charge transport material. FIG. 4 shows a case where the light emission separation layer IL includes a hole transport material.

As shown in FIG. 4, the light emitting unit 50 is formed by laminating the first electrode 31, the hole injection layer 41, the hole transport layer 42, the red light emitting layer 43, the light emission separation layer IL, the blue light emitting layer 44, the green light emitting layer 45, the electron transport layer 46, and the second electrode 61. Depending on the type of included materials, it is preferable that the hole injection layer 41 is set in the range of 1 to 20 nanometers, the hole transport layer 42 10 to 200 nanometers, the light emitting layers 5 to 50 nanometers, and the electron transport layer 43 10 to 200 nanometers.

In the display device 1, the light emission separation layer IL is formed so as to have a different configuration depending on the display color of the pixel 10. More specifically, the light emission separation layer IL is formed so that the film thickness differs depending on the display color of the pixel. In the following description, the light emission separation layer of the light emitting unit $50_R$ corresponding to the red display pixel $10_R$ is represented by reference sign $IL_R$, the light emission separation layer of the light emitting unit $50_B$ corresponding to the blue display pixel $10_B$ is represented by reference sign $IL_B$, and the light emission separation layer of the light emitting unit $50_G$ corresponding to the green display pixel $10_G$ is represented by reference sign $IL_G$.

In a case where the light emission separation layer IL includes a hole transport material, the relationship among the thickness of these films is as follows.

light emission separation layer $IL_R$<light emission separation layer $IL_B$<light emission separation layer $IL_G$ The film thickness of the light emission separation layer IL is preferably set in the range of about 0 to 20 nanometers, and it is desirable to set the thicknesses so as to maintain the above magnitude relationship within this film thickness range.

Here, variation in the emission color depending on the thickness of the light emission separation layer IL will be described with reference to FIGS. 5, 6, 7, and 8.

FIG. 5 is a schematic cross-sectional view for describing carrier recombination in a light emitting unit that emits white light by additive color mixing.

In a case where light from the red light emitting layer 43, the blue light emitting layer 44, and the green light emitting layer 45 is additively mixed to emit white with no bias in chromaticity, it is necessary to balance the light emission intensity in each light emitting layer. By sandwiching the light emission separation layer IL between the light emitting layers, the degree of carrier recombination in each light emitting layer can be adjusted. FIG. 5 shows a state in which the light emission intensity in each light emitting layer is balanced and white is emitted with no bias in chromaticity. The light emission separation layer at this time is denoted by reference sign $IL_W$.

Figure 6:
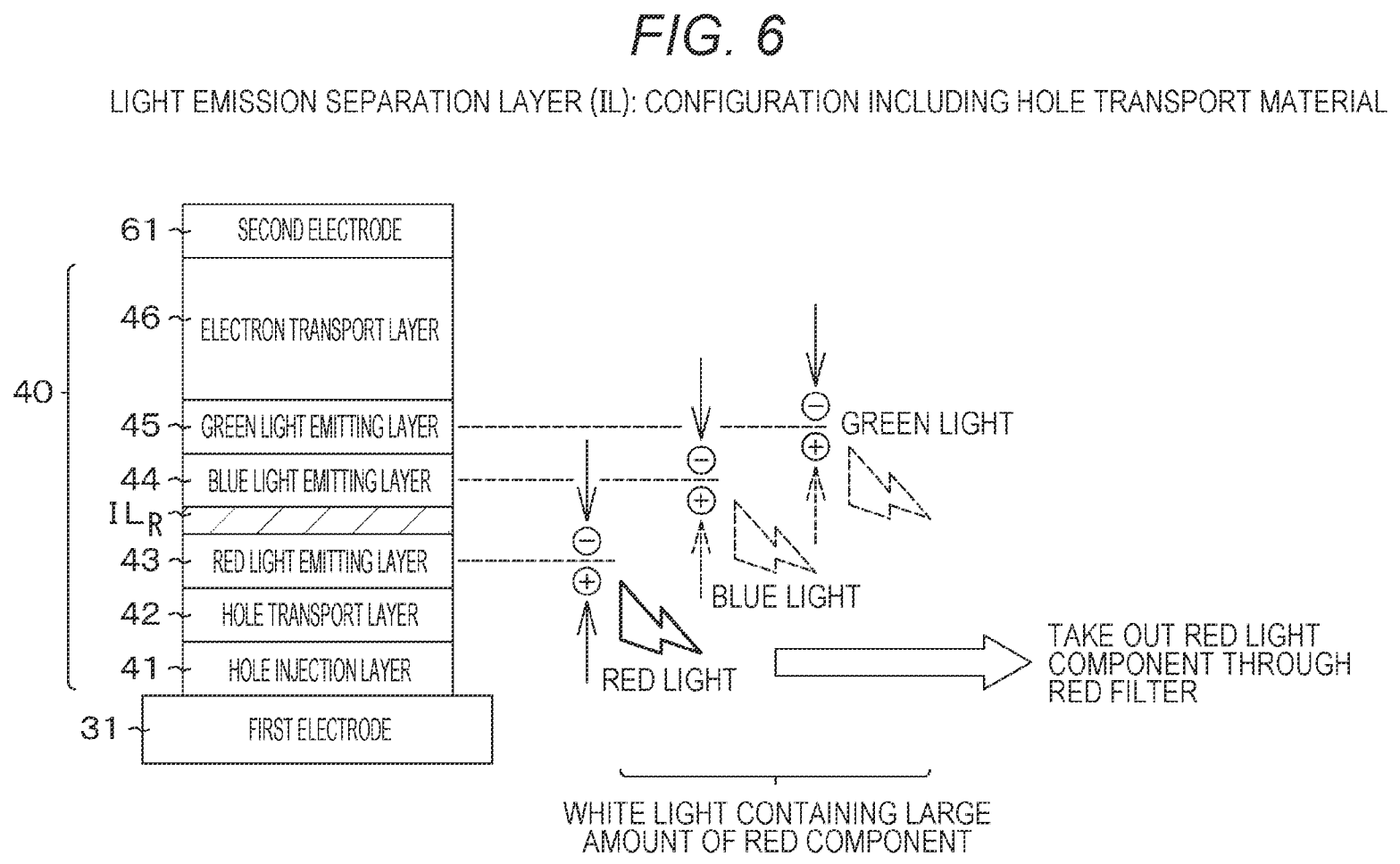

In a case where the light emission separation layer IL includes a hole transport material, the effect of injecting holes into the light emitting layer becomes relatively low when the light emission separation layer IL is made thin. Accordingly, as shown in FIG. 6, when the light emission separation layer $IL_R$ thinner than the light emission separation layer $IL_W$ is sandwiched between the light emitting layers, the center of carrier recombination is relatively shifted to the first electrode 31 side. As a result, the light emission intensity of the red light emitting layer 43 becomes relatively strong. Accordingly, when comparing the case of extracting red light from the white light shown in FIG. 5 through the red filter and the case of extracting red light from the white light shown in FIG. 6 through the red filter, stronger red light can be taken out in the latter case.

On the other hand, when the light emission separation layer IL is made thick, the hole injection effect becomes relatively strong. Accordingly, when a light emission separation layer thicker than the light emission separation layer $IL_W$ is sandwiched between the light emitting layers, the center of carrier recombination is relatively shifted to the second electrode 61 side. Accordingly, appropriately setting the film thickness of the light emission separation layer $IL_B$, the center of carrier recombination can be brought closer to the blue light emitting layer 44 (see FIG. 7). Similarly to the description in FIG. 6, when comparing the case of extracting blue light from the white light shown in FIG. 5 and the case of extracting blue light from the white light shown in FIG. 7, stronger blue light can be taken out in the latter case.

Furthermore, by appropriately setting the film thickness of the light emission separation layer $IL_G$ satisfying the relationship of light emission separation layer $IL_B$<light emission separation layer $IL_G$, the center of carrier recombination can be brought closer to the green light emitting layer 45 (see FIG. 8). Similarly to the description in FIG. 6, when comparing the case of extracting green light from the white light shown in FIG. 5 and the case of extracting green light from the white light shown in FIG. 8, stronger green light can be taken out in the latter case.

While the light emission separation layer IL has been described as including a hole transport material in the above description, an electron transport material or a bipolar charge transport material can also be used.

Figure 9:
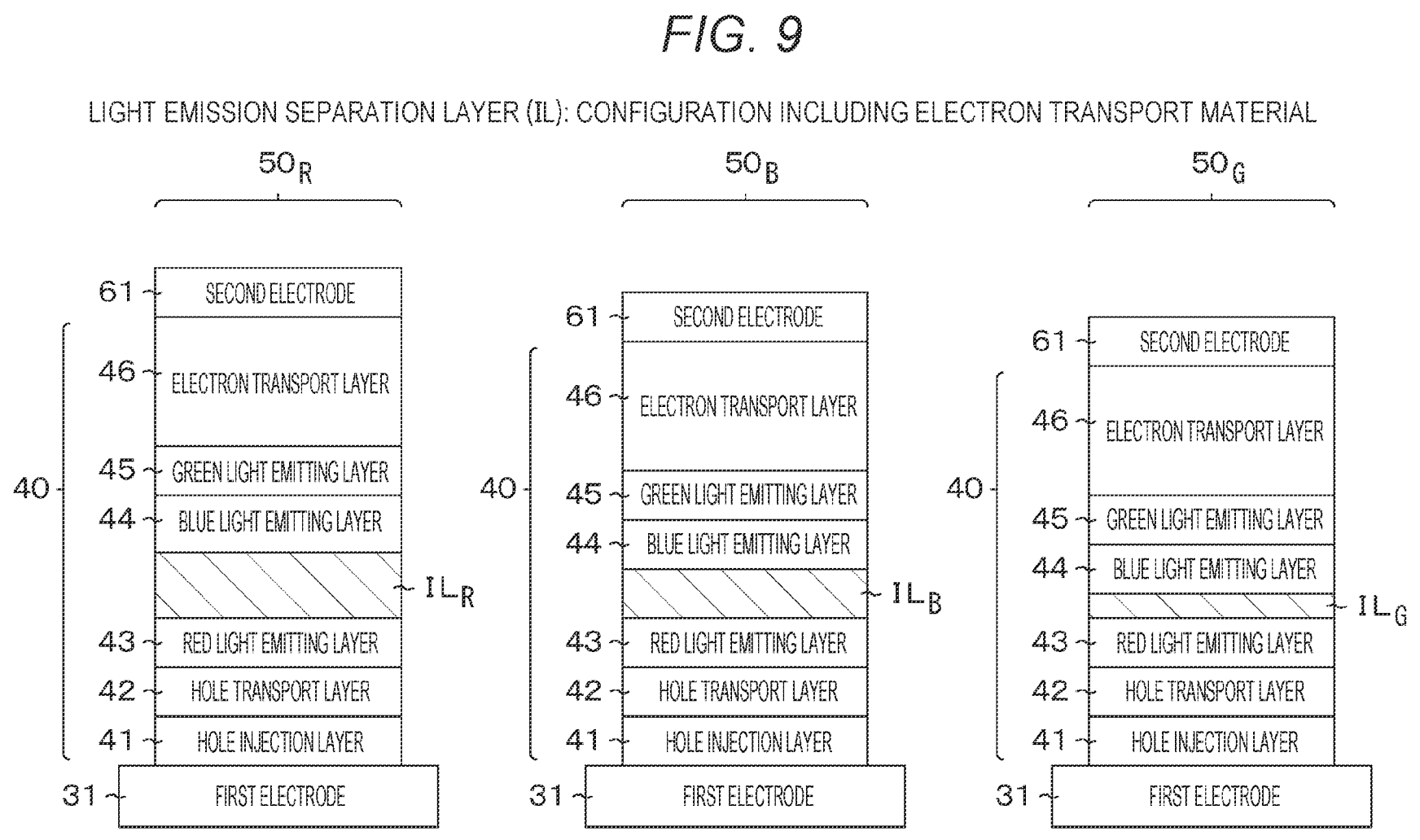

In a case where the light emission separation layer IL includes an electron transport material, the effect of injecting electrons into the light emitting layer changes. Accordingly, as the light emission separation layer IL becomes thicker, the center of carrier recombination is relatively shifted to the first electrode 31 side. As shown in FIG. 9, in a case where the light emission separation layer IL includes an electron transport material, the relationship among the film thicknesses as follows.

light emission separation layer $IL_R$>light emission separation layer $IL_B$>light emission separation layer $IL_G$ In a case where the light emission separation layer IL includes a bipolar charge transport material, if the hole transportability is dominant in terms of contribution to light emission, the lamination relationship is as shown in FIG. 4. On the other hand, if the electron transportability is dominant in terms of contribution to light emission, the lamination relationship is as shown in FIG. 9.

The detailed structure of the display device 1 has been described above. The above display device 1 can be manufactured by a manufacturing method including the steps of forming the first electrode 31 so as to correspond to each pixel 10, and laminating each of multiple light emitting layers of different types as a continuous common layer on an entire surface including the first electrodes 31, and forming the light emission separation layer IL arranged between two adjacent light emitting layers, so that the configuration of the light emission separation layer IL differs depending on the display color of the pixel 10.

Specifically, for example, the display device 1 can be manufactured in the following process. The base material 21 is prepared, and a predetermined film formation and patterning process is performed on the base material 21 to form a drive circuit including a thin film transistor. Next, the flattening film 27 is formed on the entire surface including the drive circuit. Thereafter, patterning is performed to provide an opening, and the contact plug 28 is embedded in the opening. Next, the first electrode 31 is formed by film formation and patterning.

Thereafter, an inorganic insulating material such as silicon oxynitride (SiON) is formed on the entire surface including the first electrode 31. Subsequently, the partition wall 32 is formed by performing patterning so that the first electrode 31 is exposed by a lithography method, a dry etching method, or the like.

Next, each layer is formed over the entire surface including the first electrode 31 and the partition wall 32 in the order of the hole injection layer 41, the hole transport layer 42, and the red light emitting layer 43. Thereafter, the light emission separation layer IL is formed by a mask vapor deposition method or a transfer method, so that the configuration of the light emission separation layer IL differs depending on the display color of the pixel 10. Next, each layer is formed over the entire surface in the order of the blue light emitting layer 44, the green light emitting layer 45, and the electron transport layer 46.

Thereafter, the second electrode 61 is formed over the entire surface, and further, the protective film 62 is formed. Next, the color filter 63 and the front substrate 64 are arranged on the protective film 62 to obtain the display device 1.

Note that while the light emission separation layer IL is formed by a mask vapor deposition method or a transfer method in the above method, the mask vapor deposition or the like can be omitted from the process. Specifically, with the ratio between the height of the partition wall 32 surrounding the first electrode 31 and the width of the first electrode 31 set to be different depending on the emission color of the pixel 10, the light emitting layer is line-deposited with a predetermined film forming width, and the light emission separation layer IL is line-deposited with a wider film forming width than the film forming width of the light emitting layer.

Figure 10:
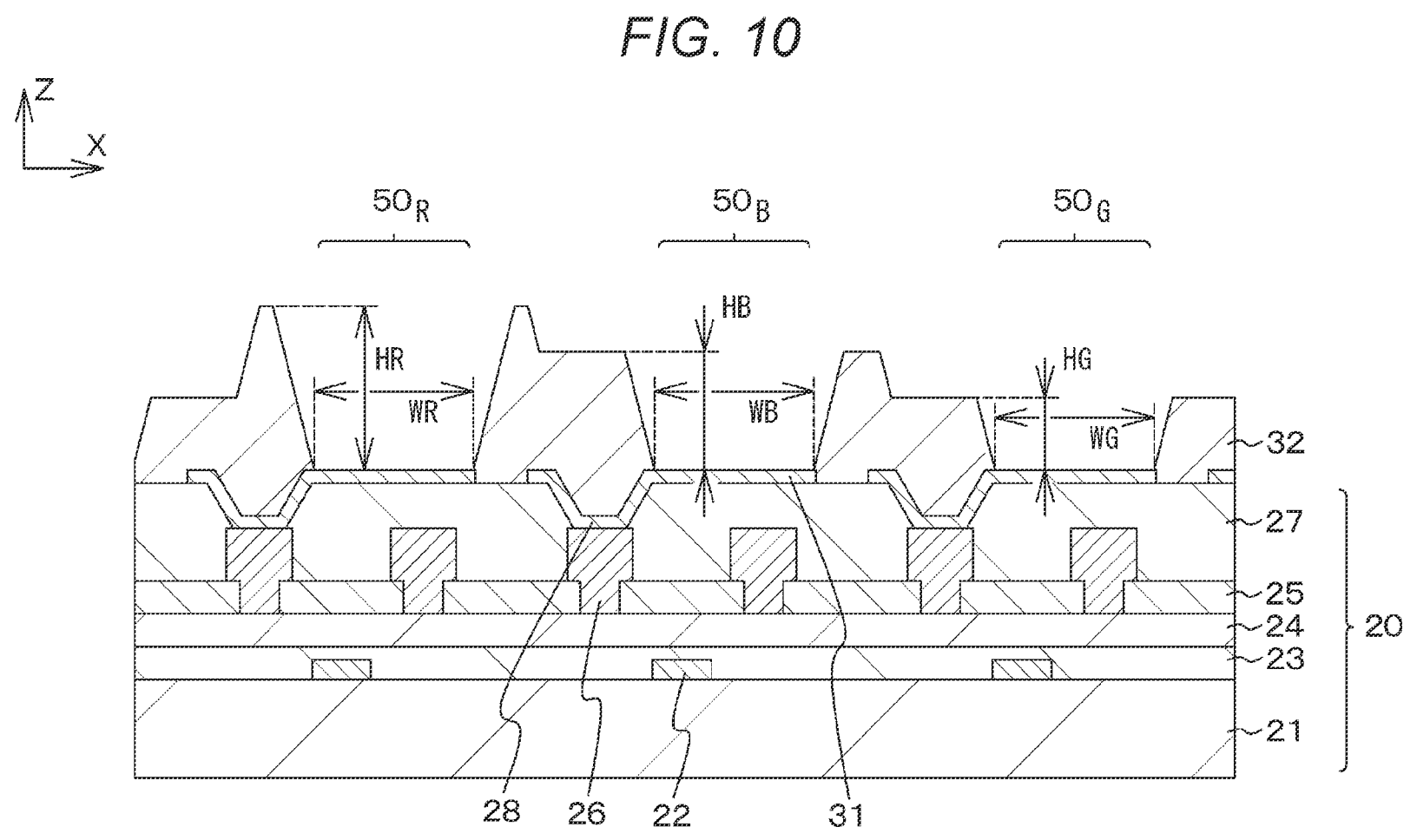
Figure 11:
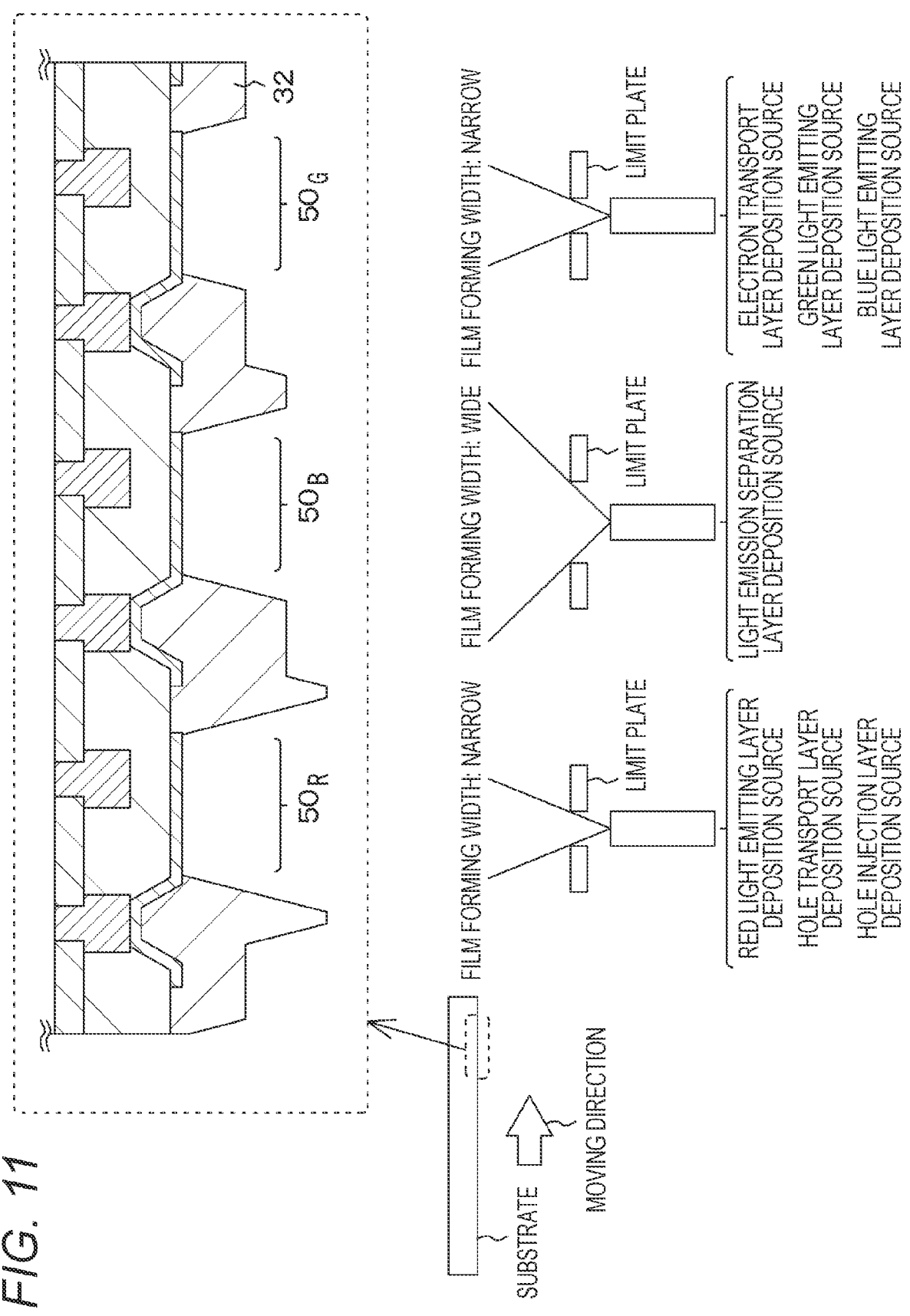
FIG. 11 is a schematic diagram for describing a vapor deposition process of the light emitting layer and the light emission separation layer.

FIG. 10 is a schematic cross-sectional view for describing a substrate in which a partition wall is formed between adjacent first electrodes. FIG. 11 is a schematic diagram for describing the vapor deposition process of the light emitting layer and the light emission separation layer.

On the substrate 20 shown in FIG. 11, the first electrode 31 and the partition wall 32 arranged between adjacent first electrodes are formed. In the following description, the width of the first electrode 31 corresponding to the red light emitting unit $50_R$ is represented by reference sign WR, the height of the partition wall 32 surrounding the first electrode 31 corresponding to the red light emitting unit $50_R$ is represented by reference sign HR, the width of the first electrode 31 corresponding to the blue light emitting unit $50_B$ is represented by reference sign WB, the height of the partition wall 32 surrounding the first electrode 31 corresponding to the blue light emitting unit $50_B$ is represented by reference sign HB, the width of the first electrode 31 corresponding to the green light emitting unit $50_G$ is represented by reference sign WG, and the height of the partition wall 32 surrounding the first electrode 31 corresponding to the green light emitting unit $50_G$ is represented by reference sign HG.

Here, the widths WR, WB, and WG of the first electrodes 31 corresponding to the light emitting units 50 are the same, whereas the heights of the partition walls 32 surrounding the first electrodes 31 are formed to be different depending on the emission color of the pixels. As a result, the ratio between the height of the partition wall 32 surrounding the first electrode 31 and the width of the first electrode 31 is set to be different depending on the emission color of the pixel 10. Specifically, the relationship is as follows.

$$HR/WR > HB/WB > HG/WG$$

Then, as shown in FIG. 11, using this substrate 20, the light emitting layer is line-deposited with a predetermined film forming width, and the light emission separation layer IL is line-deposited with a film forming width wider than the film forming width of the light emitting layer. In a case where the film forming width is narrow, even if the ratio between the height of the partition wall 32 surrounding the first electrode 31 and the width of the first electrode 31 changes, the film thickness on the substrate 20 is only affected to a small extent. On the other hand, in a case where the film forming width is wide, the film thickness on the substrate 20 is greatly affected. Specifically, when the height of the partition wall 32 surrounding the first electrode 31 is larger than the width of the first electrode 31, the film thickness becomes relatively thin. Accordingly, in the example shown in FIG. 11, while the light emitting layer and the like are formed with substantially the same film thickness, the light emission separation layer it is formed so that the film thicknesses satisfy the relationship of light emitting unit $50_R$<light emitting unit $50_B$<light emitting unit $50_G$.

Figure 12:
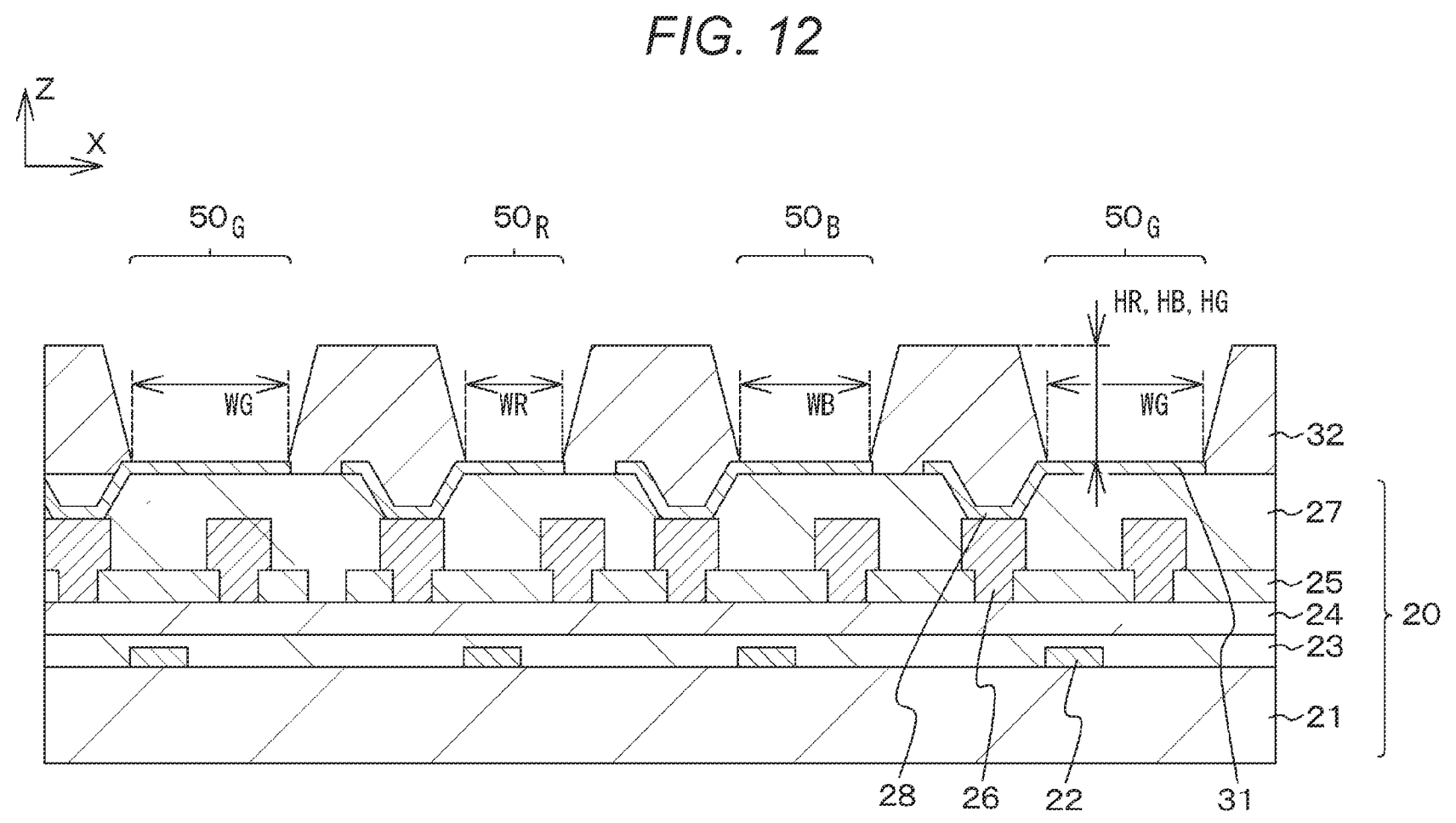

Note that as shown in FIG. 12, the heights HR, WB, WG of the partition walls 32 arranged between adjacent first electrodes may be fixed, and the widths of the first electrodes 31 corresponding to the light emitting units 50 may be formed to be different depending on the emission color of the pixels. In this configuration, too, the ratio between the height of the partition wall 32 surrounding the first electrode 31 and the width of the first electrode 31 is set to be different depending on the emission color of the pixel 10. Specifically, the relationship is as follows.

$$HR/WR > HB/WB > HG/WG$$

By performing the line deposition shown in FIG. 11 using the substrate shown in FIG. 12, too, the light emission separation layer IL is formed so that the film thicknesses satisfy the relationship of light emitting unit $50_R$<light emitting unit $50_B$<light emitting unit $50_G$.

Note that the pixel may include a resonator structure that resonates light generated in the light emitting unit. This is also true for other embodiments described later. By providing a resonator structure corresponding to the light of the color to be displayed, the color purity and the peak intensity can be improved. An example of the applied resonator structure will be described in detail later with reference to FIGS. 20 to 23.

Second Embodiment

A second embodiment also relates to a display device, a manufacturing method of a display device, and an electronic instrument according to the present disclosure.

FIGS. 1 and 3 can be referred to as a schematic plan view and a schematic partial cross-sectional view of a display device 2 according to the second embodiment by chancing the display device 1 to the display device 2. The laminating order of the organic layers is similar to the laminating order in the first embodiment.

Figure 13:
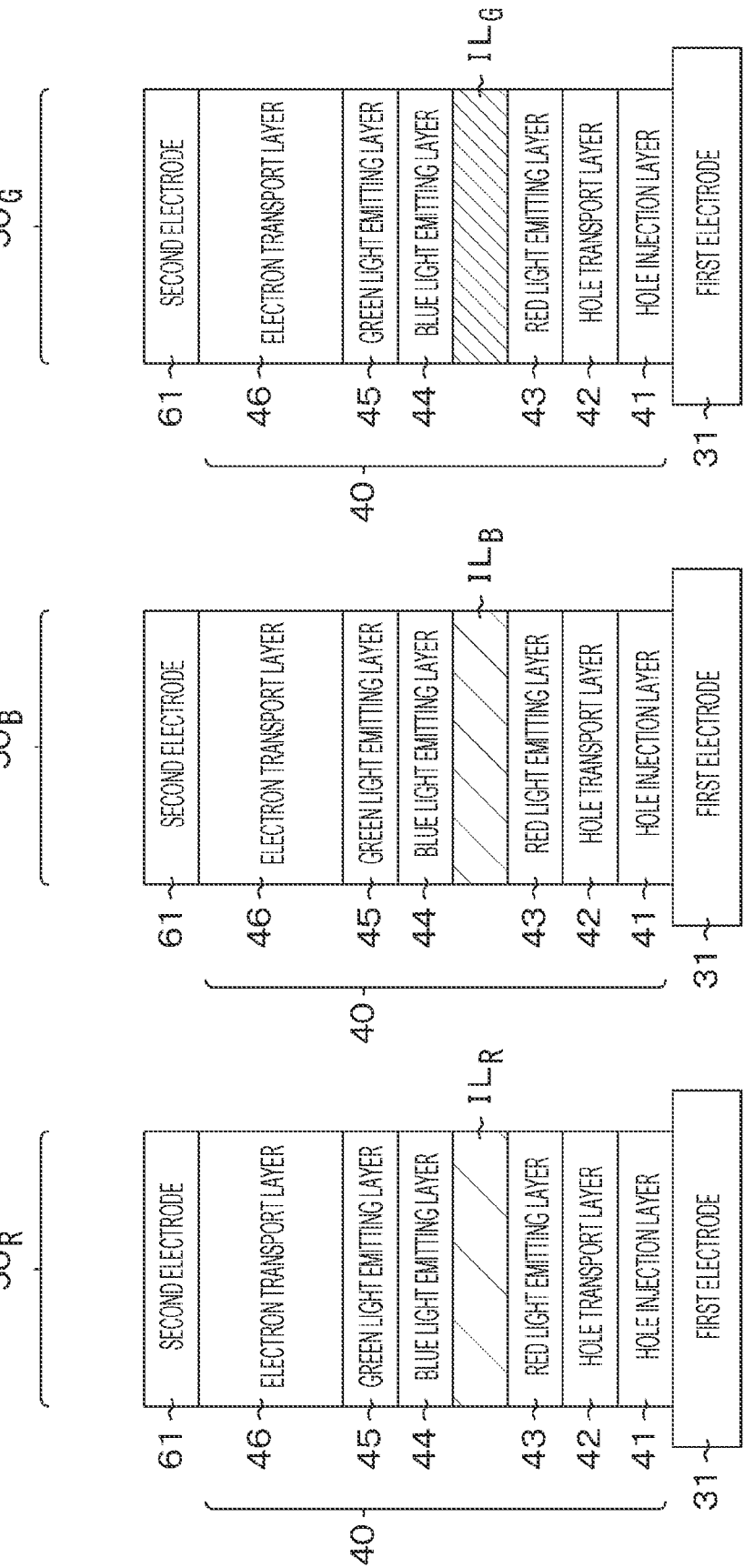
FIG. 13 is a schematic cross-sectional view for describing the lamination relationship of a first electrode, an organic layer, and a second electrode in a light emitting unit of a display device according to a second embodiment.

FIG. 13 is a schematic cross-sectional view for describing the lamination relationship of a first electrode, an organic layer, and a second electrode in a light emitting unit of the display device according to the second embodiment.

In the display device 2, too, a light emission separation layer it is formed so as to have a different configuration depending on the display color of a pixel 10. More specifically, the light emission separation layer IL is formed by using a hole transport material or an electron transport material having a different configuration depending on the display color of the pixel.

In the display device 2, the light emission separation layer is formed by using a material having a different configuration depending on the display color of the pixel. More specifically, the light emission separation layer is formed by co-depositing multiple different types of materials. The light emission separation layer is formed by co-depositing at least two of a hole transport material, an electron transport material, or a bipolar charge transport material. Here, the light emission separation layer will be described as including a co-deposited film obtained by doping a hole transport material with an electron transport material.

The light emission separation layer IL is formed so that the concentration relationship of multiple different types of materials differs depending on the display color of the pixel. That is, the concentration of the electron transport material in a light emission separation layer $IL_R$, a light emission separation layer $IL_B$, and a light emission separation layer $IL_G$ is set in the range of 0 to 80 weight percent, for example, so as to satisfy the magnitude relationship of light emission separation layer $IL_R$<light emission separation layer $IL_B$<light emission separation layer $IL_G$.

Next, a modification will be described.

FIG. 14 is a schematic cross-sectional view for describing the lamination relationship of a first electrode, an organic layer, and a second electrode in a light emitting unit of a display device according to the modification of the second embodiment.

In this modification, too, a light emission separation layer will be described as including a co-deposited film obtained by doping a hole transport material with an electron transport material. Note, however, that the example is different from FIG. 13 in that the concentration distribution in the lamination direction is different in the light emission separation layer. For example, the concentration of the electron transport material in the light emission separation layer IL decreases toward the second electrode 61 side, and the degree of concentration distribution varies as follows.

light emission separation layer $IL_R$<light emission separation layer $IL_B$<light emission separation layer $IL_G$ The light emission separation layer IL of the second embodiment can be formed so as to have a different configuration depending on the display color of the pixel 10 by a mask vapor deposition method or a transfer method, for example.

Third Embodiment

A third embodiment also relates to a display device, a manufacturing method of a display device, and an electronic instrument according to the present disclosure.

FIGS. 1 and 3 can be referred to as a schematic plan view and a schematic partial cross-sectional view of a display device 3 according to the third embodiment by chancing the display device 1 to the display device 3. The laminating order of the organic layers is similar to the laminating order in the first embodiment.

FIG. 15 is a schematic cross-sectional view for describing the lamination relationship of a first electrode, an organic layer, and a second electrode in a light emitting unit of the display device according to the third embodiment.

In the display device 3, too, a light emission separation layer IL is formed so as to have a different configuration depending on the display color of a pixel 10. More specifically, the light emission separation layer IL is formed by using a hole transport material or an electron transport material having a different configuration depending on the display color of the pixel.

In the display device 3, the light emission separation layer IL is formed by using a material having a different configuration depending on the display color of the pixel. More specifically, the light emission separation layer IL is formed by laminating multiple different types of materials. The light emission separation layer IL is formed by laminating at least two of a hole transport material, an electron transport material, or a bipolar charge transport material. Here, the light emission separation layer IL will be described as being formed by laminating a hole transport material and an electron transport material.

The light emission separation layer IL is formed so that the lamination ratio of multiple different types of materials differs depending on the display color of the pixel. The light emission separation layer IL is formed by laminating a layer $IL_1$ including a hole transport material located on the first electrode 31 side and a layer $IL_2$ including an electron transport material located on the second electrode 61 side. Then the film thickness ratio of the layer $IL_1$ to the layer $IL_2$ is set so as to satisfy the following magnitude relationship.

light emission separation layer $IL_R$<light emission separation layer $IL_B$<light emission separation layer $IL_G$ Note that each film thickness is preferably set in the range of about 0 to 20 nanometers.

The light emission separation layer IL of the third embodiment can be formed so as to have a different configuration depending on the display color of the pixel 10 by a mask vapor deposition method or a transfer method, for example.

Fourth Embodiment

A fourth embodiment also relates to a display device, a manufacturing method of a display device, and an electronic instrument according to the present disclosure.

FIGS. 1 and 3 can be referred to as a schematic plan view and a schematic partial cross-sectional view of a display device 4 according to the fourth embodiment by chancing the display device 1 to the display device 4.

In the fourth embodiment, multiple light emission separation layers are arranged between light emitting layers. More specifically, the light emission separation layer includes a first light emission separation layer arranged between a first light emitting layer and a second light emitting layer, and a second light emission separation layer arranged between the second light emitting layer and a third light emitting layer.

In the display device 4, too, a light emission separation layer it is formed so as to have a different configuration depending on the display color of a pixel 10. More specifically, at least one of the first light emission separation layer or the second light emission separation layer is formed so as to have a different configuration depending on the display color of the pixel.

Figure 16:
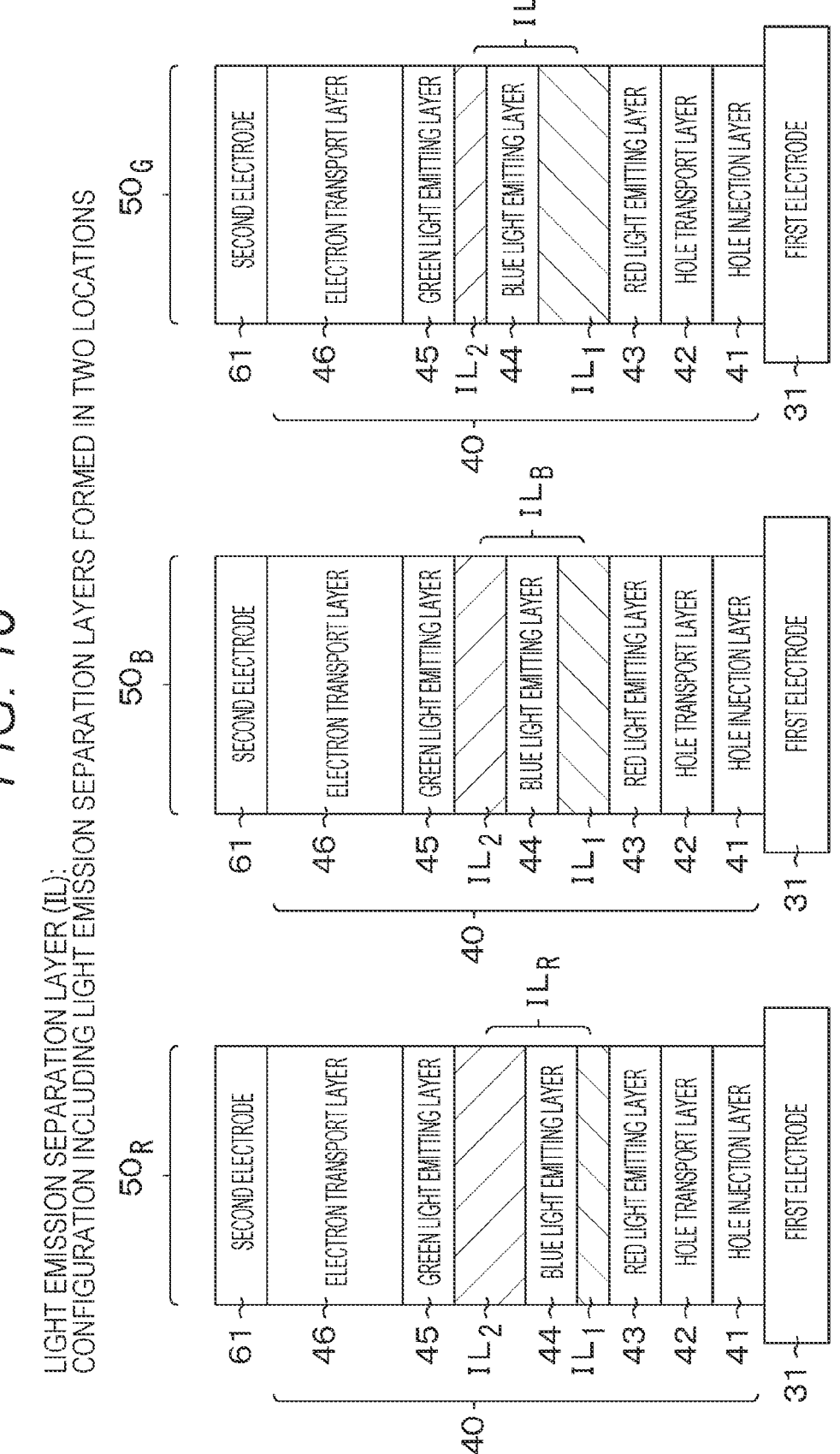
FIG. 16 is a schematic cross-sectional view for describing the lamination relationship of a first electrode, an organic layer, and a second electrode in a light emitting unit of a display device according to a fourth embodiment.

FIG. 16 is a schematic cross-sectional view for describing the lamination relationship of a first electrode, an organic layer, and a second electrode in a light emitting unit of the display device according to the fourth embodiment.

In the example shown in FIG. 16, a first light emission separation layer $IL_1$ is arranged between a red light emitting layer 43 and a blue light emitting layer 44, and a second light emission separation layer $IL_2$ is arranged between the blue light emitting layer 44 and a green light emitting layer 45. The light emission separation layer IL includes a combination of the first light emission separation layer $IL_1$ and the second light emission separation layer $IL_2$.

The first light emission separation layer $IL_1$ and the second light emission separation layer $IL_2$ are formed by using at least one of a hole transport material, an electron transport material, or a bipolar charge transport material. Here, the first light emission separation layer $IL_1$ is described as including a hole transport material and the second light emission separation layer $IL_2$ is described as including an electron transport material.

The film thickness ratio of the first light emission separation layer $IL_1$ to the second light emission separation layer $IL_2$ is set so as to satisfy the following magnitude relationship.

light emission separation layer $IL_R$<light emission separation layer $IL_B$<light emission separation layer $IL_G$ Note that each film thickness is preferably set in the range of about 0 to 20 nanometers.

The first light emission separation layer $IL_1$ and the second light emission separation layer $IL_2$ of the fourth embodiment can be formed so as to have a different configuration depending on the display color of the pixel 10 by a mask deposition method or a transfer method, for example.

Fifth Embodiment

A fifth embodiment also relates to a display device, a manufacturing method of a display device, and an electronic instrument according to the present disclosure.

FIGS. 1 and 3 can be referred to as a schematic plan view and a schematic partial cross-sectional view of a display device 5 according to the fifth embodiment by changing the display device 1 to the display device 5. The laminating order of the organic layers is similar to the laminating order in the first embodiment.

Figure 17:
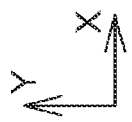
FIG. 17 is a schematic plan view for describing the arrangement of pixels in a display device according to a fifth embodiment.

FIG. 17 is a schematic plan view for describing the arrangement of pixels in the display device according to the fifth embodiment.

The display device 5 is a display device in which white pixels are also included in addition to red, blue, and green pixels. By adding white pixels, it is possible to further improve the brightness.

Figure 18:
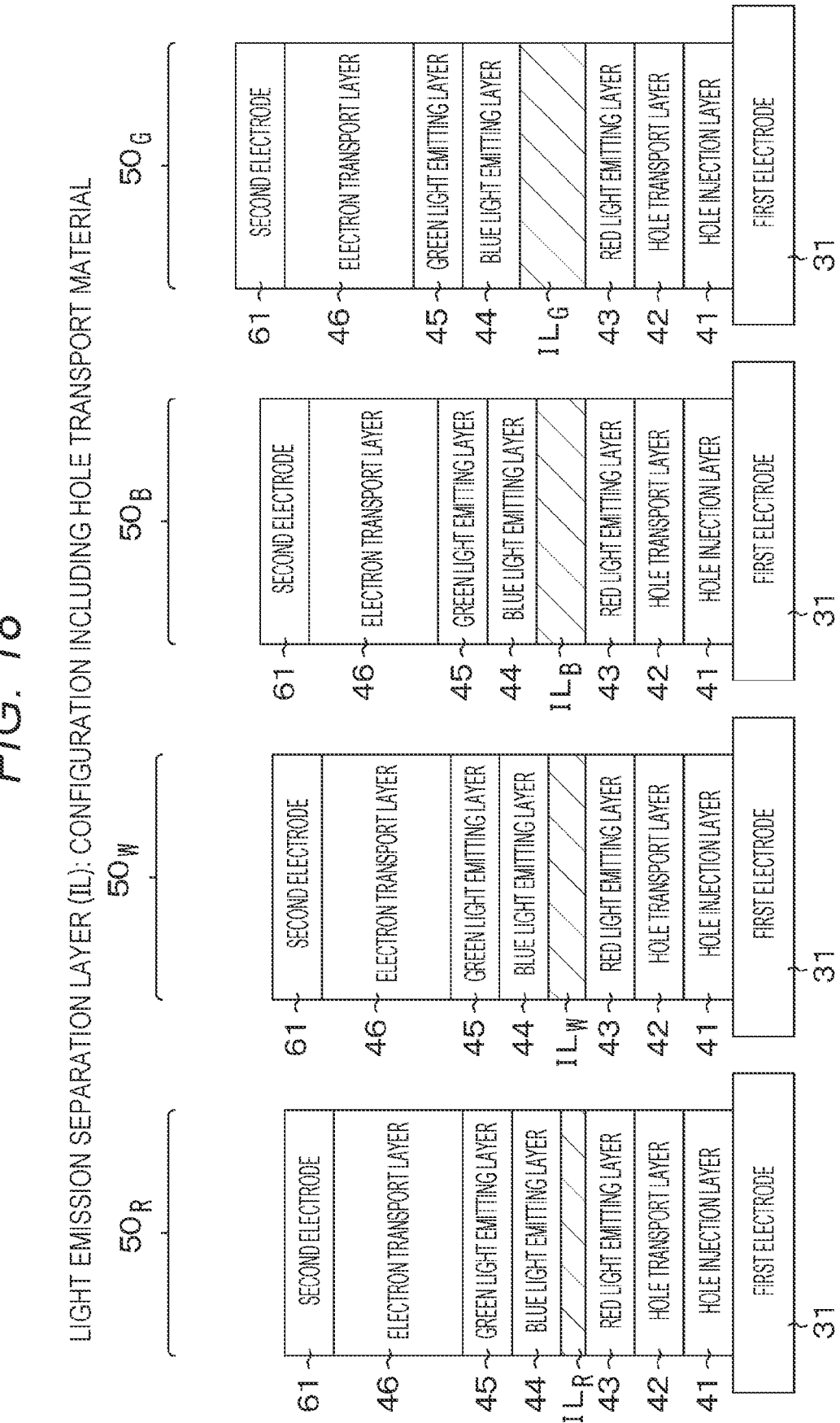
FIG. 18 is a schematic cross-sectional view for describing the lamination relationship of a first electrode, an organic layer, and a second electrode in a light emitting unit.

FIG. 18 is a schematic cross-sectional view for describing the lamination relationship of a first electrode, an organic layer, and a second electrode in a light emitting unit.

In the display device 5, too, a light emission separation layer IL is formed so as to have a different configuration depending on the display color of a pixel 10. More specifically, the light emission separation layer IL is formed so that the film thickness differs depending on the display color of the pixel.

In a case where the light emission separation layer IL includes a hole transport material, the relationship among the film thicknesses is as follows.

light emission separation layer $IL_R$<light emission separation layer $IL_W$<light emission separation layer $IL_B$<light emission separation layer $IL_G$ The film thickness of the light emission separation layer IL is preferably set in the range of about 0 to 20 nanometers, and it is desirable to set the thicknesses so as to maintain the above magnitude relationship within this film thickness range.

Figure 19:
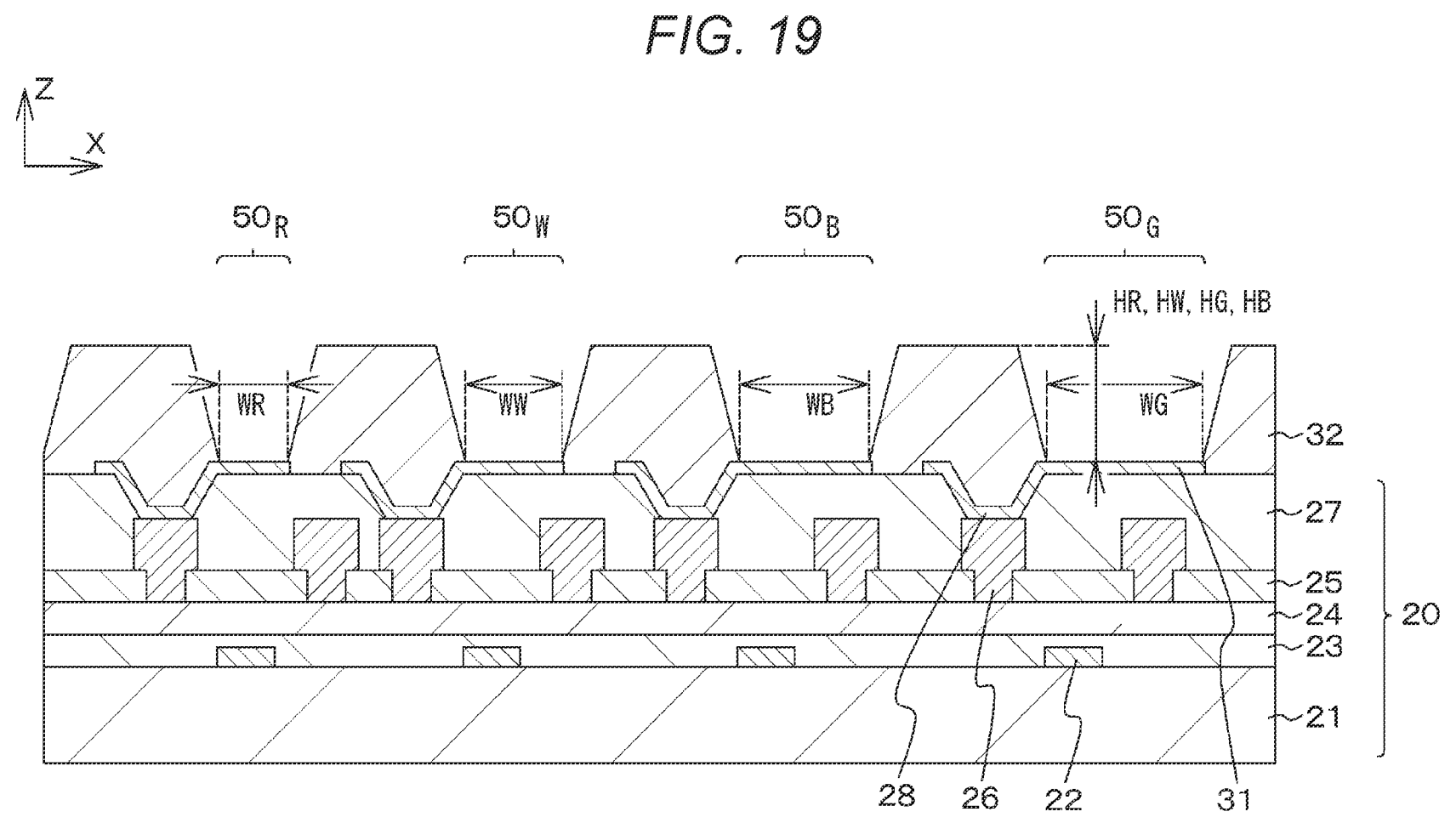

The display device 5 can be manufactured by a manufacturing method similar to that described in the first embodiment. In a case where line deposition is performed, the partition walls may be formed so as to have different heights as shown in FIG. 10, or first electrodes 31 corresponding to light emitting units 50 may be formed so as to have different widths depending on the emission color of the pixels as shown in FIG. 12. An example of the latter is shown in FIG. 19.

According to the display device according to the present disclosure described above, the organic layer includes multiple different types of light emitting layers and a light emission separation layer arranged between the light emitting layers, the multiple different types of light emitting layers are each laminated as a common layer extending continuously over the pixels, and the light emission separation layer is formed so as to have a different configuration depending on the display color of the pixel. Since a light emission separation layer having a different configuration is arranged for the pixel of each color, it is possible to set the red display pixel to emit red light strongly, the blue display pixel to emit blue light strongly, and the green display pixel to emit green light strongly, for example. Accordingly, while maintaining the white method, carriers that have been used for emitting colors that are not involved in display can be collected in a light emitting layer corresponding to the color to be displayed to some extent. As a result, the internal luminous efficiency can be improved.

[Example of Resonator Structure Applied to Each Embodiment]

The pixel used in the display device according to the present disclosure described above can include a resonator structure that resonates light generated in the light emitting unit. Hereinafter, the resonator structure will be described with reference to the drawings.

(Resonator Structure: First Example)

Figures 20A, 20B:
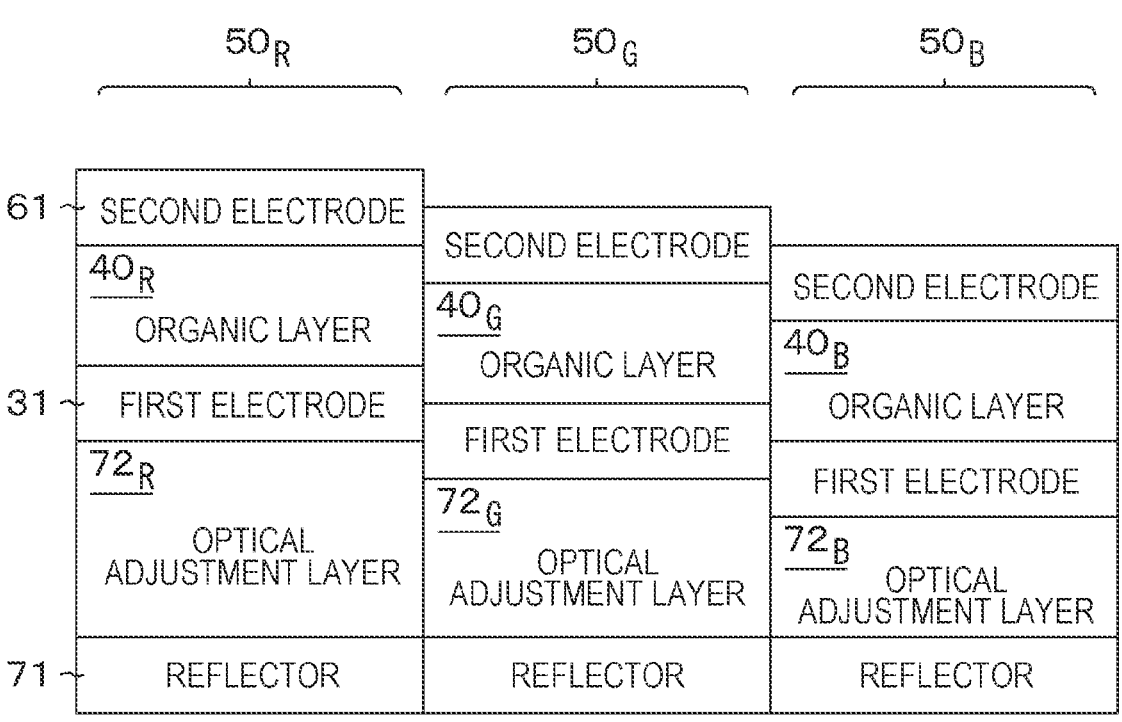
FIG. 20A is a schematic cross-sectional view for describing a first example of a resonator structure.
FIG. 20B is a schematic cross-sectional view for describing a second example of the resonator structure.

FIG. 20A is a schematic cross-sectional view for describing a first example of the resonator structure.

In the first example, a first electrode 31 is formed with a common film thickness in each light emitting unit 50. The same applies to a second electrode 61.

A reflector 71 is arranged below the first electrode 31 of the light emitting unit 50 with an optical adjustment layer 72 interposed therebetween. A resonator structure that resonates light generated by an organic layer 40 is formed between the reflector 71 and the second electrode 61.

The reflector 71 is formed with a common film thickness in each light emitting unit 50. The film thickness of the optical adjustment layer 72 differs depending on the color to be displayed by the pixel. Since optical adjustment layers $72_R$, $72_G$, and $72_B$ have different film thicknesses, it is possible to set an optical distance that causes optimum resonance for the wavelength of light according to the color to be displayed.

In the example shown in FIG. 20A, upper surfaces of the reflectors 71 in the light emitting units $50_R$, $50_G$, and $50_B$ are arranged so as to be aligned. As described above, since the film thickness of the optical adjustment layer 72 differs depending on the color to be displayed by the pixel, the position of the upper surface of the second electrode 61 differs depending on the type of the light emitting unit $50_R$, $50_G$, or $50_B$.

The reflector 71 can be formed by using, for example, a metal such as aluminum (Al), silver (Ag), or copper (Cu), or an alloy containing these as a main component.

The optical adjustment layer 72 can be formed by using an inorganic insulating material such as silicon nitride ($SiN_x$), silicon oxide ($SiO_x$), or silicon oxynitride ($SiO_xN_y$), or an organic resin material such as an acrylic resin or a polyimide resin. The optical adjustment layer 72 may be a single layer or a laminated film including these multiple materials. Additionally, the number of layers may be different depending on the type of the light emitting unit 50.

The first electrode 31 can be formed by using a transparent conductive material such as indium tin oxide (ITO), indium zinc oxide (IZO), or zinc oxide (ZnO).

The second electrode 61 needs to function as a transflective film. The second electrode 61 can be formed by using magnesium (Mg) or silver (Ag), a magnesium-silver alloy (MgAg) containing these as a main component, or an alloy containing an alkali metal or an alkaline earth metal.

(Resonator Structure: Second Example)

FIG. 20B is a schematic cross-sectional view for describing a second example of the resonator structure.

In the second example, too, a first electrode 31 and a second electrode 61 are formed with a common film thickness in each light emitting unit 50.

Then, in the second example, too, a reflector 71 is arranged below the first electrode 31 of the light emitting unit 50 with an optical adjustment layer 72 interposed therebetween. A resonator structure that resonates light generated by an organic layer 40 is formed between the reflector 71 and the second electrode 61. Similarly to the first example, the reflector 71 is formed with a common film thickness in each light emitting unit 50, and the film thickness of the optical adjustment layer 72 differs depending on the color to be displayed by the pixel.

In the first example shown in FIG. 20A, the upper surfaces of the reflectors 71 in the light emitting units 50$_R$, 50$_G$, and 50$_B$ are arranged so as to be aligned, and the positions of the upper surfaces of the second electrode 61 differ depending on the types of the light emitting units 50$_R$, 50$_G$, and 50$_B$.

On the other hand, in the second example shown in FIG. 20B, the upper surfaces of the second electrodes 61 are arranged so as to be aligned in the light emitting units 50$_R$, 50$_G$, and 50$_B$. In order to align the upper surfaces of the second electrodes 61, the upper surfaces of the reflectors 71 in the light emitting units 50$_R$, 50$_G$, and 50$_B$ are arranged so as to differ depending on the type of the light emitting units 50$_R$, 50$_G$, and 50$_B$. For this reason, lower surfaces of the reflectors 71 (in other words, surface of base 73 denoted by reference sign 73 in FIG. 20B) have a stepped shape according to the types of the light emitting units 50.

The materials and the like of the reflector 71, the optical adjustment layer 72, the first electrode 31, and the second electrode 61 are similar to those described in the first example, and thus the description thereof will be omitted.

(Resonator Structure: Third Example)

Figure 21A:
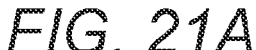
FIG. 21A is a schematic cross-sectional view for describing a third example of the resonator structure.

FIG. 21A is a schematic cross-sectional view for describing a third example of the resonator structure.

In the third example, too, a first electrode 31 and a second electrode 61 are formed with a common film thickness in each light emitting unit 50.

Then, in the third example, too, a reflector 71 is arranged below the first electrode 31 of the light emitting unit 50 with an optical adjustment layer 72 interposed therebetween. A resonator structure that resonates light generated by an organic layer 40 is formed between the reflector 71 and the second electrode 61. Similarly to the first and second examples, the film thickness of the optical adjustment layer 72 differs depending on the color to be displayed by the pixel. Then, similarly to the second example, the positions of upper surfaces of the second electrodes 61 are arranged so that light emitting units 50$_R$, 50$_G$, and 50$_B$ are aligned.

In the second example shown in FIG. 20B, the lower surface of the reflectors 71 has a stepped shape according to the types of the light emitting units 50 in order to align the upper surfaces of the second electrodes 61.

On the other hand, in the third example shown in FIG. 21A, the film thicknesses of the reflectors 71 are set to be different depending on the types of the light emitting units 50$_R$, 50$_G$, and 50$_B$. More specifically, the film thicknesses are set so that lower surfaces of reflectors 71$_R$, 71$_G$, and 71$_B$ are aligned.

The materials and the like of the reflector 71, the optical adjustment layer 72, the first electrode 31, and the second electrode 61 are similar to those described in the first example, and thus the description thereof will be omitted.

(Resonator Structure: Fourth Example)

Figure 21B:
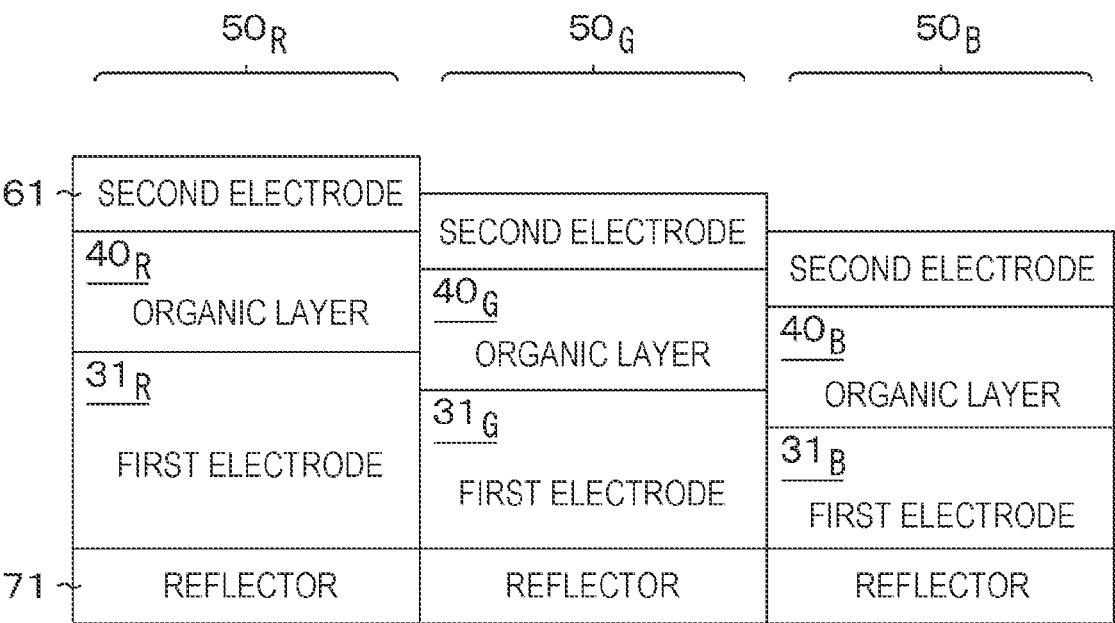
FIG. 21B is a schematic cross-sectional view for describing a fourth example of the resonator structure.

FIG. 21B is a schematic cross-sectional view for describing a fourth example of the resonator structure.

In the first example shown in FIG. 20A, the first electrode 31 and the second electrode 61 of each light emitting unit 50 are formed with a common film thickness. Then, the reflector 71 is arranged below the first electrode 31 of the light emitting unit 50 with the optical adjustment layer 72 interposed therebetween.

On the other hand, in the fourth example shown in FIG. 21B, the optical adjustment layer 72 is omitted, and the film thicknesses of first electrodes 31 are set to be different depending on the types of the light emitting units 50$_R$, 50$_G$, and 50$_B$.

The reflector 71 is formed with a common film thickness in each light emitting unit 50. The film thickness of the first electrode 31 differs depending on the color to be displayed by the pixel. Since the first electrodes 31$_R$, 31$_G$, and 31$_B$ have different film thicknesses, it is possible to set an optical distance that causes optimum resonance for the wavelength of light according to the color to be displayed.

The materials and the like of the reflector 71, the optical adjustment layer 72, the first electrode 31, and the second electrode 61 are similar to those described in the first example, and thus the description thereof will be omitted.

(Resonator Structure: Fifth Example)

FIG. 22A is a schematic cross-sectional view for describing a fifth example of the resonator structure.

In the first example shown in FIG. 20A, the first electrode 31 and the second electrode 61 are formed to have a common film thickness in each light emitting unit 50. Then, the reflector 71 is arranged below the first electrode 31 of the light emitting unit 50 with the optical adjustment layer 72 interposed therebetween.

On the other hand, in the fifth example shown in FIG. 22A, the optical adjustment layer 72 is omitted, and an oxide film 74 is formed on the surface of a reflector 71 instead. The film thicknesses of the oxide films 74 are set to be different depending on the types of light emitting units 50$_R$, 50$_G$, and 50$_B$.

The film thickness of the oxide film 74 differs depending on the color to be displayed by the pixel. Since the oxide films 74$_R$, 74$_G$, and 74$_B$ have different film thicknesses, it is possible to set an optical distance that causes optimum resonance for the wavelength of light according to the color to be displayed.

The oxide film 74 is a film obtained by oxidizing the surface of the reflector 71, and includes, for example, aluminum oxide, tantalum oxide, titanium oxide, magnesium oxide, zirconium oxide, and the like. The oxide film 74 functions as an insulating film for adjusting the optical path length (optical distance) between the reflector 71 and a second electrode 61.

The oxide films 74 having different film thicknesses depending on the types of the light emitting units 50$_R$, 50$_G$, and 50$_B$ can be formed in the following manner, for example.

First, a container is filled with an electrolytic solution, and a substrate on which the reflector 71 is formed is immersed in the electrolytic solution. Additionally, the electrodes are arranged so as to face the reflector 71.

Then, a positive voltage is applied to the reflector 71 with the electrode as a reference to anodize the reflector 71. The film thickness of the oxide film due to anodization is proportional to the voltage value applied to the electrode. Hence, anodizing is performed in a state where a voltage corresponding to the type of the light emitting unit 50 is applied to each of the reflectors 71$_R$, 71$_G$, and 71$_B$. As a result, oxide films 74 having different film thicknesses can be collectively formed.

The materials and the like of the reflector 71, the first electrode 31, and the second electrode 61 are similar to those described in the first example, and thus the description thereof will be omitted.

(Resonator Structure: Sixth Example)

FIG. 22B is a schematic cross-sectional view for describing a sixth example of the resonator structure.

In the sixth example, a light emitting unit 50 is formed by laminating a first electrode 31, an organic layer 40, and a second electrode 61. Note, however, that in the sixth example, the first electrode 31 is formed so as to have the functions of both an electrode and a reflector. The first electrode (and reflector) 31 includes a material having optical constants selected according to the type of light emitting unit $50_R$, $50_G$, or $50_B$. Since the first electrodes (and reflectors) 31 have different phase shifts, it is possible to set an optical distance that causes optimum resonance for the wavelength of light according to the color to be displayed.

The first electrode (and reflector) 31 can include a single metal such as aluminum (Al), silver (Ag), gold (Au), or copper (Cu), or an alloy containing these as main components. For example, first electrode (and reflector) $31_R$ of a light emitting unit $50_R$ may include copper (Cu), and a first electrode (and reflector) $31_G$ of a light emitting unit $50_G$ and a first electrode (and reflector) $31_B$ of a light emitting unit $50_B$ may include aluminum.

The materials and the like of the second electrode 61 are similar to those described in the first example, and thus the description thereof will be omitted.

(Resonator Structure: Seventh Example)

Figure 23:
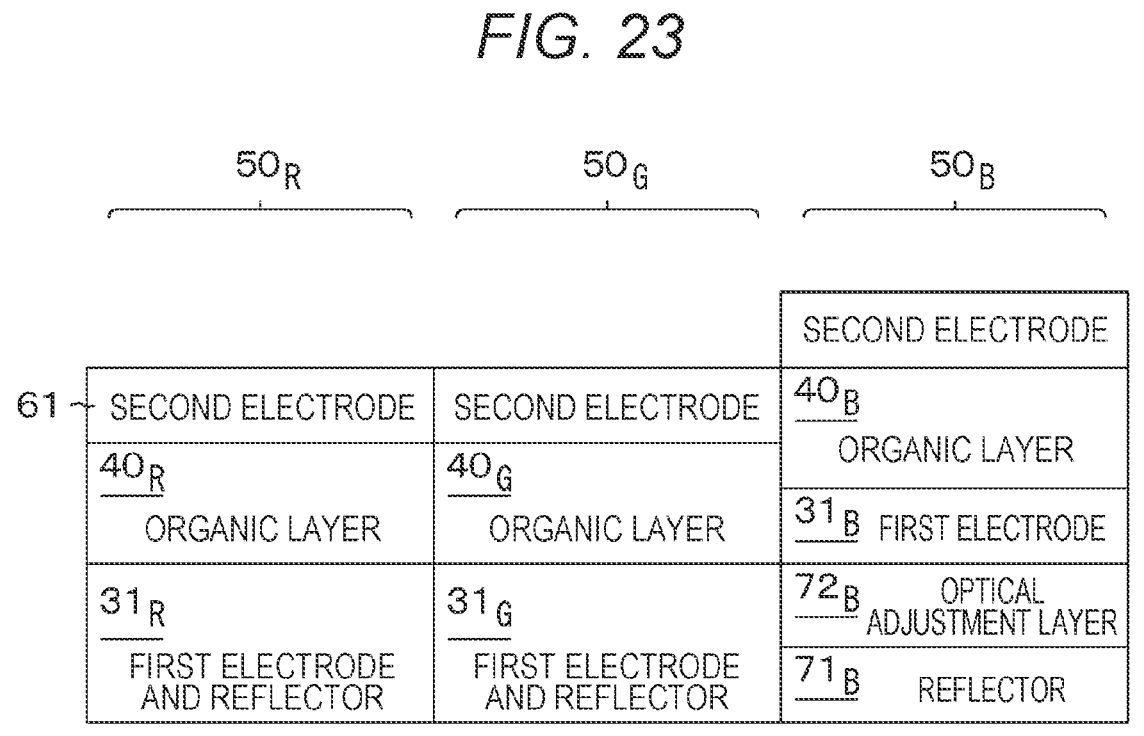

FIG. 23 is a schematic cross-sectional view for describing a seventh example of the resonator structure.

The seventh example is basically a configuration in which the sixth example is applied to light emitting units $50_R$ and $50_G$, and the first example is applied to a light emitting unit $50_B$. In this configuration, too, it is possible to set an optical distance that causes optimum resonance for the wavelength of light according to the color to be displayed.

First electrodes (and reflectors) $31_R$ and $31_G$ used for the light emitting units $50_R$ and $50_G$ can include a single metal such as aluminum (Al), silver (Ag), gold (Au), or copper (Cu), or an alloy containing these as main components.

The materials and the like of a reflector $71_B$, an optical adjustment layer $72_B$, and a first electrode $31_B$ used for the light emitting unit $50_B$, are similar to those described in the first example, and thus the description thereof will be omitted.

[Electronic Instrument]

The display device of the present disclosure described above can be used as a display unit (display device) of an electronic instrument in all fields for displaying a video signal input to an electronic instrument or a video signal generated in an electronic instrument as an image or a video. As an example, the display device of the present disclosure can be used as a display unit of, for example, a television set, a digital still camera, a notebook personal computer, a mobile terminal device such as a mobile phone, a video camera, a head mounted display, or the like.

The display device of the present disclosure also includes a modular type having a sealed configuration. One example is a display module formed by attaching a facing portion such as transparent glass to a pixel array unit. Note that the display module may be provided with a circuit unit, a flexible printed circuit (FPC), or the like for inputting and outputting signals or the like to the pixel array unit from the outside. Hereinafter, a digital still camera and a head-mounted display will be illustrated as specific examples of the electronic instrument using the display device of the present disclosure. Note, however, that the specific examples illustrated here are only examples, and the electronic instrument is not limited to these.

Specific Example 1

Figure 24A:
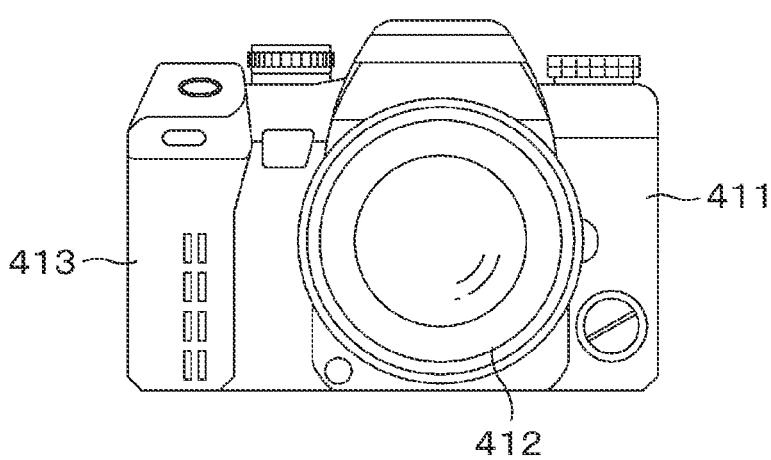
FIG. 24 is an external view of an interchangeable lens single-lens reflex type digital still camera, whose front view is shown in FIG. 24A and rear view is shown in FIG. 24B.
Figure 24B:
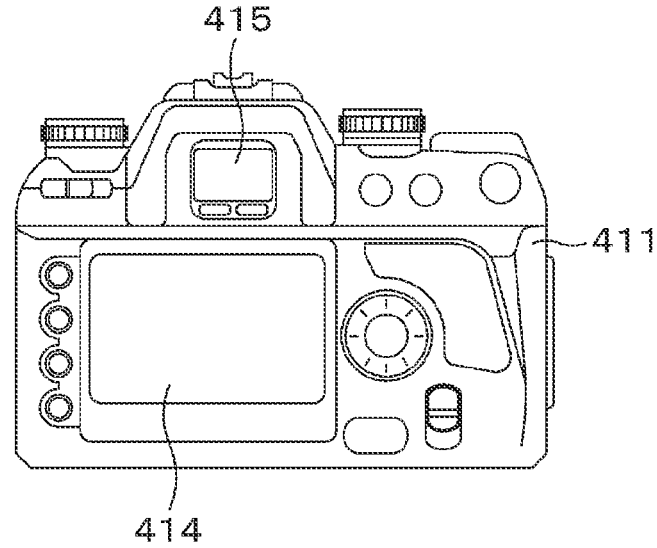

FIG. 24 is an external view of an interchangeable lens single-lens reflex type digital still camera, whose front view is shown in FIG. 24A and rear view is shown in FIG. 24B. An interchangeable lens single-lens reflex type digital still camera has an interchangeable imaging lens unit (interchangeable lens) 412 on the front right side of a camera main body portion (camera body) 411, and has a grip portion 413 for the image capturing person to grip on the front left side of the camera main body portion 411, for example.

Then, a monitor 414 is provided substantially in the center of a back surface of the camera main body portion 411. A viewfinder (eyepiece window) 415 is provided above the monitor 414. By looking into the viewfinder 415, the image capturing person can visually recognize the optical image of the subject guided by the imaging lens unit 412 and determine the composition.

In the interchangeable lens single-lens reflex type digital still camera having the above configuration, the display device of the present disclosure can be used as the viewfinder 415. That is, the interchangeable lens single-lens reflex type digital still camera according to this example is manufactured by using the display device of the present disclosure as its viewfinder 415.

Specific Example 2

Figure 25:
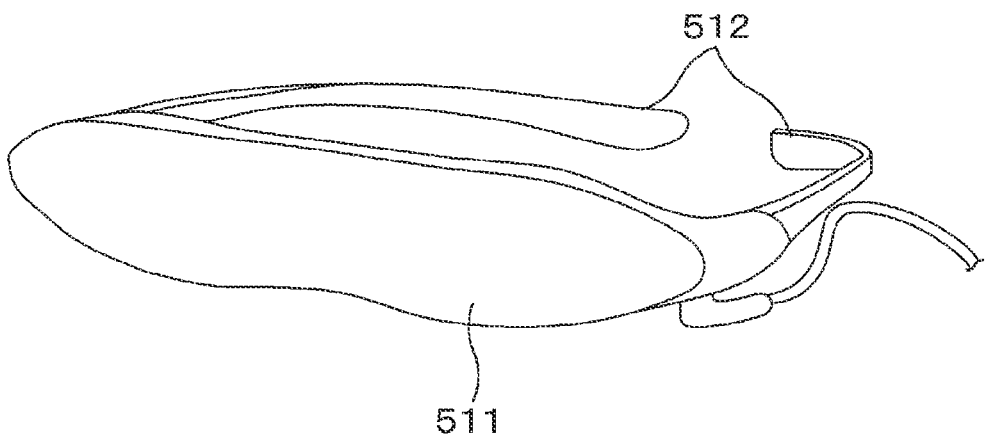
FIG. 25 is an external view of a head-mounted display.

FIG. 25 is an external view of the head-mounted display. The head-mounted display has, for example, ear hooks 512 for wearing on the user's head on both sides of an eyeglass-shaped display unit 511. In this head-mounted display, the display device of the present disclosure can be used as the display unit 511. That is, the head-mounted display according to this example is manufactured by using the display device of the present disclosure as the display unit 511.

Specific Example 3

Figure 26:
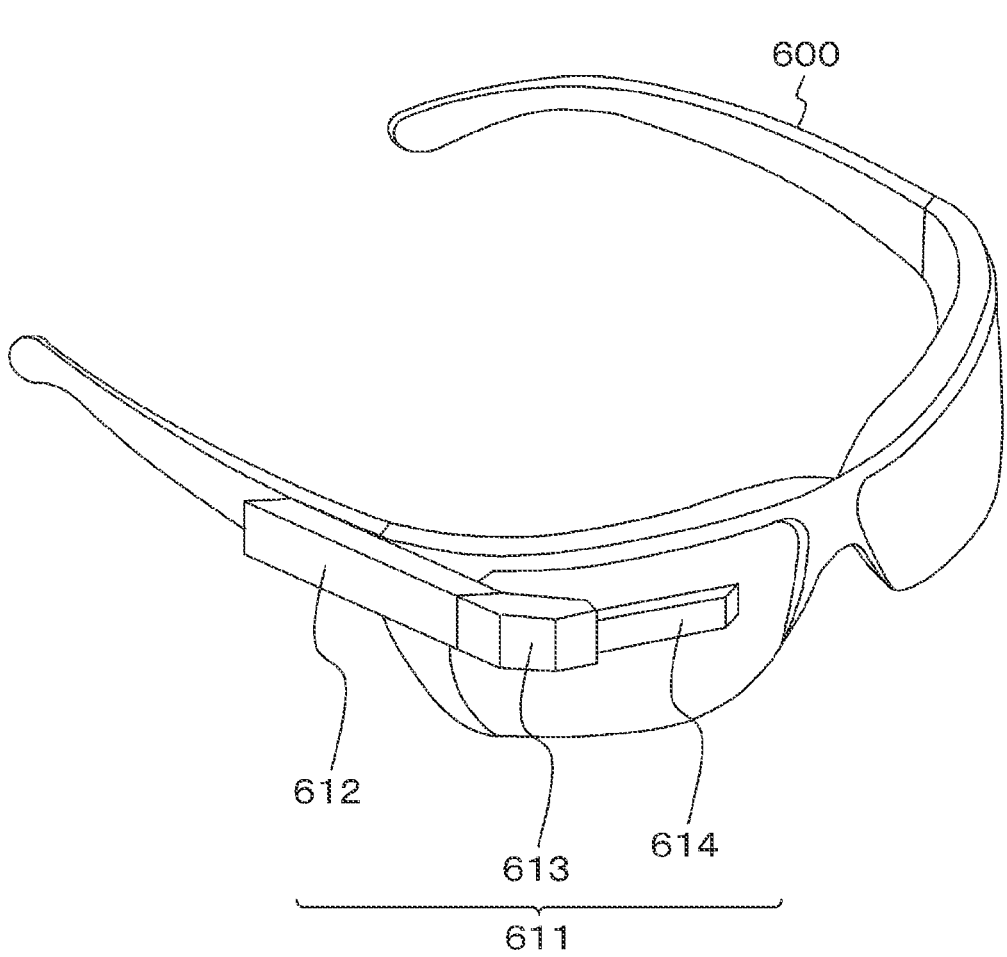
FIG. 26 is an external view of a see-through head-mounted display.

FIG. 26 is an external view of a see-through head-mounted display. A see-through head-mounted display 611 includes a main body portion 612, an arm 613, and a lens barrel 614.

The main body portion 612 is connected to the arm 613 and eyeglasses 600. Specifically, an end of the main body portion 612 in the long side direction is connected to the arm 613, and one side of a side surface of the main body portion 612 is connected to the eyeglasses 600 through a connecting member. Note that the main body portion 612 may be directly mounted on the head of a human body.

The main body portion 612 incorporates a control board for controlling the operation of the see-through head-mounted display 611 and a display unit. The arm 613 connects the main body portion 612 and the lens barrel 614 to support the lens barrel 614. Specifically, the arm 613 is coupled to each of an end of the main body portion 612 and an end of the lens barrel 614 to fix the lens barrel 614. Additionally, the arm 613 incorporates a signal line for communicating data related to images provided to the lens barrel 614 from the main body portion 612.

The lens barrel 614 projects image light provided from the main body portion 612 through the arm 613 toward the eyes of the user wearing the see-through head-mounted display 611, through an eyepiece lens. In this see-through head-mounted display 611, the display device of the present disclosure can be used for the display unit of the main body portion 612.

Other

Note that the technology of the present disclosure can also be configured in the following manner.

[A1]

A display device in which pixels each including a light emitting unit formed by laminating a first electrode, an organic layer, and a second electrode are arranged in a two-dimensional matrix, in which:

the organic layer includes multiple light emitting layers of different types and a light emission separation layer;

each of the multiple light emitting layers of different types is laminated as a common layer extending continuously over the pixels; and the light emission separation layer is arranged between two adjacent light emitting layers, and is formed so as to have a different configuration depending on a display color of the pixel.

[A2]

The display device described in [A1] above, in which the light emission separation layer is formed so that a film thickness differs depending on the display color of the pixel.

[A3]

The display device described in [A2] above, in which the light emission separation layer is formed by using at least one of a hole transport material, an electron transport material, or a bipolar charge transport material.

[A4]

The display device described in [A1] above, in which the light emission separation layer is formed by using a material having a different composition depending on the display color of the pixel.

The display device described in [A1] above, in which the light emission separation layer is formed by co-depositing multiple different types of materials.

[A6]

The display device described in [A5] above, in which the light emission separation layer is formed so that a concentration relationship of multiple different types of materials differs depending on the display color of the pixel.

[A7]

The display device described in [A5] or [A6] above, in which the light emission separation layer is formed by co-depositing at least two of a hole transport material, an electron transport material, or a bipolar charge transport material.

[A8]

The display device described in [A1] above, in which the light emission separation layer is formed by laminating multiple different types of materials.

[A9]

The display device described in [A8] above, in which the light emission separation layer is formed so that a lamination ratio of multiple different types of materials differs depending on the display color of the pixel.

[A10]

The display device described in [A8] or [A9] above, in which the light emission separation layer is formed by laminating at least two of a hole transport material, an electron transport material, or a bipolar charge transport material.

[A11]

The display device described in [A1] above, in which:

the organic layer includes a first light emitting layer, a second light emitting layer, and a third light emitting layer, each of which is different in type;

the light emitting layers are arranged in the order of the first light emitting layer, the second light emitting layer, and the third light emitting layer, each light emitting layer being arranged as a common layer extending continuously over the pixels; and the light emission separation layer includes a first light emission separation layer arranged between the first light emitting layer and the second light emitting layer, and a second light emission separation layer arranged between the second light emitting layer and the third light emitting layer.

[A12]

The display device described in [A11] above, in which at least one of the first light emission separation layer or the second light emission separation layer is formed so as to have a different configuration depending on the display color of the pixel.

[A13]

The display device described in [A11] or [A12] above, in which the first light emission separation layer and the second light emission separation layer are formed by using at least one of a hole transport material, an electron transport material, or a bipolar charge transport material.

[A14]

The display device described in any one of [A1] to [A13] above, in which the organic layer includes a red light emitting layer, a blue light emitting layer, and a green light emitting layer, and the light emitting layers are laminated in the order of the red light emitting layer, the blue light emitting layer, and the green light emitting layer, each light emitting layer being laminated as a common layer extending continuously over the pixels.

[A15]

The display device described in any one of [A1] to [A14] above, in which a color filter corresponding to a color to be displayed is arranged on an upper surface of each pixel.

[A16]

The display device described in any one of [A1] to [A15] above, in which the pixel has a resonator structure that resonates light generated in the light emitting unit.

[B1]

A manufacturing method of a display device in which pixels each including a light emitting unit formed by laminating a first electrode, an organic layer, and a second electrode are arranged in a two-dimensional matrix, the method including the steps of forming the first electrode so as to correspond to each pixel, and laminating each of multiple light emitting layers of different types as a continuous common layer on an entire surface including the first electrodes, and forming a light emission separation layer arranged between two adjacent light emitting layers, so that a configuration of the light emission separation layer differs depending on a display color of the pixel.

[B2]

The manufacturing method of a display device described in [B1] above, further including the step of forming a partition wall between adjacent first electrodes, in which with the ratio between the height of the partition wall surrounding the first electrode and the width of the first electrode set to be different depending on an emission color of the pixel, the light emitting layer is line-deposited with a predetermined film forming width, and the light emission separation layer is line-deposited with a wider film forming width than the film forming width of the light emitting layer.

[C1]

An electronic instrument including a display device in which pixels each including a light emitting unit formed by laminating a first electrode, an organic layer, and a second electrode are arranged in a two-dimensional matrix, in which:

the organic layer includes multiple light emitting layers of different types and a light emission separation layer;

each of the multiple light emitting layers of different types is laminated as a common layer extending continuously over the pixels; and the light emission separation layer is arranged between two adjacent light emitting layers, and is formed so as to have a different configuration depending on a display color of the pixel.

[C2]

The electronic instrument described in [C1] above, in which the light emission separation layer is formed so that a film thickness differs depending on the display color of the pixel.

[C3]

The electronic instrument described in [C2] above, in which the light emission separation layer is formed by using at least one of a hole transport material, an electron transport material, or a bipolar charge transport material.

[C4]

The electronic instrument described in [C1] above, in which the light emission separation layer is formed by using a material having a different composition depending on the display color of the pixel.

The electronic instrument described in [C1] above, in which the light emission separation layer is formed by co-depositing multiple different types of materials.

The electronic instrument described in [C5] above, in which the light emission separation layer is formed so that a concentration relationship of multiple different types of materials differs depending on the display color of the pixel.

The electronic instrument described in [C5] or [C6] above, in which the light emission separation layer is formed by co-depositing at least two of a hole transport material, an electron transport material, or a bipolar charge transport material.

[C8]

The electronic instrument described in [C1] above, in which the light emission separation layer is formed by laminating multiple different types of materials.

[C9]

The electronic instrument described in [C8] above, in which the light emission separation layer is formed so that a lamination ratio of multiple different types of materials differs depending on the display color of the pixel.

[C10]

The electronic instrument described in [C8] or [C9] above, in which the light emission separation layer is formed by laminating at least two of a hole transport material, an electron transport material, or a bipolar charge transport material.

[C11]

The electronic instrument described in [C1] above, in which:

the organic layer includes a first light emitting layer, a second light emitting layer, and a third light emitting layer, each of which is different in type;

the light emitting layers are arranged in the order of the first light emitting layer, the second light emitting layer, and the third light emitting layer, each light emitting layer being arranged as a common layer extending continuously over the pixels; and the light emission separation layer includes a first light emission separation layer arranged between the first light emitting layer and the second light emitting layer, and a second light emission separation layer arranged between the second light emitting layer and the third light emitting layer.

[C12]

The electronic instrument described in [C11] above, in which at least one of the first light emission separation layer or the second light emission separation layer is formed so as to have a different configuration depending on the display color of the pixel.

[C13]

The electronic instrument described in [C11] or [C12] above, in which the first light emission separation layer and the second light emission separation layer are formed by using at least one of a hole transport material, an electron transport material, or a bipolar charge transport material.

[C14]

The electronic instrument according to any one of [C1] to [C13] above, in which the organic layer includes a red light emitting layer, a blue light emitting layer, and a green light emitting layer, and the light emitting layers are laminated in the order of the red light emitting layer, the blue light emitting layer, and the green light emitting layer, each light emitting layer being laminated as a common layer extending continuously over the pixels.

[C15]

The electronic instrument according to any one of [C1] to [C14] above, in which a color filter corresponding to a color to be displayed is arranged on an upper surface of each pixel.

[C16]

The electronic instrument according to any one of [C1] to [C15] above, in which the pixel has a resonator structure that resonates light generated in the light emitting unit.

REFERENCE SIGNS LIST

1 Display device
10 Pixel

11 Display area
20 Substrate
21 Base material
22 Gate electrode
23 Gate insulating film
24 Semiconductor material layer
25 Flattening film
26 Source/drain electrode
27 Flattening film
28 Contact plug
31, 31$_R$, 31$_G$, 31$_B$ First electrode
32 Partition wall
40, 40$_R$, 40$_G$, 40$_B$ Organic layer
41 Hole injection layer
42 Hole transport layer
43 First light emitting layer (red light emitting layer)
44 Second light emitting layer (blue light emitting layer)
45 Third light emitting layer (green light emitting layer)
46 Electron transport layer
50 Light emitting unit
61 Second electrode
62 Protective film
63 Color filter
64 Front substrate
71, 71$_R$, 71$_G$, 71$_B$ Reflector
72$_R$, 72$_G$, 72$_B$ Optical adjustment layer
73 Base surface
74$_R$, 74$_G$, 74$_B$ Oxide film
IL Light emission separation layer
100 Power supply unit
101 Scanning unit
102 Data driver
411 Camera main body portion
412 Imaging lens unit
413 Grip portion
414 Monitor
415 Viewfinder
511 Eyeglass-shaped display unit
512 Ear hook
600 Eyeglasses (eyewear)
611 See-through head-mounted display
612 Main body portion
613 Arm
614 Lens barrel

The invention claimed is:

1. A display device comprising:
a plurality of pixels including a first pixel, a second pixel, a third pixel and a fourth pixel that are arranged in a two-dimensional matrix, and
a partition wall between any two of the first pixel, the second pixel, the third pixel and the fourth pixel, each of the pixels including
a first electrode above a substrate;
a first light emitting layer above the first electrode;
a first light emission separation layer above the first light emitting layer, the first light emission separation layer including at least one of a hole transport layer or an electron transport layer;
a second light emitting layer above the first light emission separation layer;
a second light emission separation layer above the second light emitting layer, the second light emission separation layer including at least one of a hole transport layer or an electron transport layer;
a third light emitting layer above the second light emission separation layer;
a second electrode above the third light emitting layer;

a reflector between the substrate and the first electrode; and
an optical adjustment layer between the first electrode and the reflector, and wherein
a thickness of the first light emission separation layer is different from a thickness of the second light emission separation layer in at least one of the first pixel, the second pixel, the third pixel or the fourth pixel;
a thickness of the optical adjustment layer in one of the first pixel, the second pixel, the third pixel or the fourth pixel is different from a thickness of the optical adjustment layer in another one of the first pixel, the second pixel, the third pixel or the fourth pixel;
the first pixel and the second pixel are adjacent in a vertical direction in a first column of the two-dimensional matrix;
the third pixel and the fourth pixel are adjacent in the vertical direction in a second column of the two-dimensional matrix;
the first pixel and the fourth pixel are adjacent in a horizontal direction in a first row of the two-dimensional matrix;
the second pixel and the third pixel are adjacent in the horizontal direction in a second row of the two-dimensional matrix;
in a plan view, an area of a light emitting unit of the first pixel, an area of a light emitting unit of the second pixel, an area of a light emitting unit of the third pixel, and an area of a light emitting unit of the fourth pixel are different from each other;
the first pixel, the second pixel, and the third pixel have mutually different display colors;
the mutually different display colors include a red display color, a green display color, and a blue display color;
the first pixel, the second pixel, and the third pixel have mutually different emission intensities for their mutually different display colors;
the first pixel is for a red color;
the second pixel is for a green color;
the third pixel is for a blue color;
the thickness of the first light emission separation layer for the first pixel is less than the thickness of the first light emission separation layer for the second pixel; and
the thickness of the first light emission separation layer for the second pixel is less than the thickness of the first light emission separation layer for the third pixel.

2. The display device according to claim 1, wherein the vertical direction is parallel to an extending direction of data lines that respectively supply luminance-based signal voltages to the pixels.

3. The display device according to claim 2, wherein the horizontal direction is parallel to an extending direction of scanning lines that respectively supply scanning signals to the pixels.

4. The display device according to claim 1, wherein respective reflectors of adjacent ones of the pixels are separated from each other.

5. The display device according to claim 4, wherein upper surfaces of the respective reflectors of the first pixel, the second pixel, the third pixel, and the fourth pixel are at a same level in a cross-sectional view.

6. The display device according to claim 1, wherein upper surfaces of respective reflectors of the first pixel, the second pixel, the third pixel, and the fourth pixel are at a same level in a cross-sectional view.

7. The display device according to claim 1, wherein a thickness of the second light emission separation layer is less than 20 nm.

8. The display device according to claim 1, further comprising:

color filters respectively corresponding to colors to be displayed arranged on an upper surface of each of the pixels.

9. The display device according to claim 1, further comprising:

a resonator structure configured to resonate light.

10. An electronic apparatus comprising the display device according to claim 1.

11. The electronic apparatus according to claim 10, wherein the vertical direction is parallel to an extending direction of data lines that respectively supply luminance-based signal voltages to the pixels.

12. The electronic apparatus according to claim 11, wherein the horizontal direction is parallel to an extending direction of scanning lines that respectively supply scanning signals to the pixels.

13. The electronic apparatus according to claim 10, wherein respective reflectors of adjacent ones of the pixels are separated from each other.

14. The electronic apparatus according to claim 13, wherein upper surfaces of the respective reflectors of the first pixel, the second pixel, the third pixel, and the fourth pixel are at a same level in a cross-sectional view.

15. The electronic apparatus according to claim 10, wherein upper surfaces of respective reflectors of the first pixel, the second pixel, the third pixel, and the fourth pixel are at a same level in a cross-sectional view.

16. The electronic apparatus according to claim 10, wherein a thickness of the second light emission separation layer is less than 20 nm.

17. The electronic apparatus according to claim 10, further comprising:

color filters respectively corresponding to colors to be displayed arranged on an upper surface of each of the pixels.

18. The electronic apparatus according to claim 10, further comprising:

a resonator structure configured to resonate light.

19. The display device according to claim 1, wherein the thickness of the second light emission separation layer for the first pixel is greater than the thickness of the second light emission separation layer for the second pixel, and the thickness of the second light emission separation layer for the second pixel is greater than the thickness of the second light emission separation layer for the third pixel.

\* \* \* \* \*